(12) United States Patent
Hill

(10) Patent No.: US 7,812,964 B2
(45) Date of Patent: Oct. 12, 2010

(54) DISTANCE MEASURING INTERFEROMETER AND ENCODER METROLOGY SYSTEMS FOR USE IN LITHOGRAPHY TOOLS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 358 days.

(21) Appl. No.: 11/941,012

(22) Filed: Nov. 15, 2007

(65) Prior Publication Data

US 2008/0165345 A1 Jul. 10, 2008

Related U.S. Application Data

(60) Provisional application No. 60/859,348, filed on Nov. 15, 2006, provisional application No. 60/859,693, filed on Nov. 17, 2006.

(51) Int. Cl.
*G01B 11/02* (2006.01)
*G01B 9/02* (2006.01)
*G01N 21/00* (2006.01)

(52) U.S. Cl. .................. 356/500; 356/73; 356/486; 356/499

(58) Field of Classification Search ............ 356/73, 356/484–486, 488, 498–500
See application file for complete search history.

(56) References Cited

U.S. PATENT DOCUMENTS

| | | | |
|---|---|---|---|
| 4,685,803 A | 8/1987 | Sommargren | |
| 4,688,940 A | 8/1987 | Sommargren et al. | |
| 4,733,967 A | 3/1988 | Sommargren | |
| 4,948,254 A | 8/1990 | Ishida | |
| 5,404,222 A | 4/1995 | Lis | |
| 5,537,209 A | 7/1996 | Lis | |
| 5,552,617 A | 9/1996 | Hill et al. | |
| 5,764,362 A | 6/1998 | Hill et al. | |
| 5,838,485 A | 11/1998 | de Groot et al. | |
| 6,137,574 A | 10/2000 | Hill | |
| 6,198,574 B1 | 3/2001 | Hill | |
| 6,201,609 B1 | 3/2001 | Hill | |
| 6,246,481 B1 | 6/2001 | Hill | |
| 6,252,668 B1 | 6/2001 | Hill | |
| 6,330,065 B1 | 12/2001 | Hill | |
| 6,407,816 B1 | 6/2002 | de Groot et al. | |
| 6,430,465 B2 * | 8/2002 | Cutler | .................. 700/193 |
| 6,495,847 B1 | 12/2002 | Asano et al. | |

(Continued)

FOREIGN PATENT DOCUMENTS

EP 0 843 152 5/1998

(Continued)

OTHER PUBLICATIONS

U.S. Appl. No. 60/862,949, filed Oct. 2006, Hill.

(Continued)

*Primary Examiner*—Michael A Lyons
(74) *Attorney, Agent, or Firm*—Fish & Richardson P.C.

(57) ABSTRACT

In general, in one aspect, the invention features a system that includes a moveable stage, an interferometer configured to provide information about a first degree of freedom of the stage, an encoder configured to provide information about a second degree of freedom of the stage, and an electronic processor configured to monitor the position of the stage based on the information about the first and second degrees of freedom.

34 Claims, 12 Drawing Sheets

U.S. PATENT DOCUMENTS

| | | |
|---|---|---|
| 6,529,279 B2 | 3/2003 | De Groot et al. |
| 6,573,996 B1 | 6/2003 | Deliwala et al. |
| 6,757,066 B2 | 6/2004 | Hill |
| 6,765,195 B1 | 7/2004 | Leviton |
| 6,775,009 B2 | 8/2004 | Hill |
| 6,778,280 B2 | 8/2004 | de Groot |
| 6,806,961 B2 | 10/2004 | Hill |
| 6,819,434 B2 | 11/2004 | Hill |
| 6,839,141 B2 | 1/2005 | Hill |
| 6,842,256 B2 | 1/2005 | Hill |
| 6,888,638 B1 | 5/2005 | Hill |
| 6,891,624 B2 | 5/2005 | Hill |
| 6,937,349 B2 | 8/2005 | Jones et al. |
| 6,950,192 B2 | 9/2005 | Hill |
| 7,012,700 B2 | 3/2006 | de Groot et al. |
| 7,038,850 B2 | 5/2006 | Chang et al. |
| 7,075,619 B2 | 7/2006 | Hill |
| 7,106,454 B2 | 9/2006 | de Groot et al. |
| 7,139,081 B2 | 11/2006 | de Groot |
| 7,268,888 B2 | 9/2007 | Hill |
| 7,280,223 B2 | 10/2007 | Hill |
| 7,280,224 B2 | 10/2007 | Hill |
| 7,283,248 B2 | 10/2007 | Hill |
| 7,362,446 B2 * | 4/2008 | Van Der Pasch et al. .... 356/499 |
| 7,528,961 B2 | 5/2009 | Hill |
| 2003/0048458 A1 | 3/2003 | Mieher et al. |
| 2003/0164948 A1 | 9/2003 | Hill |
| 2003/0179357 A1 | 9/2003 | Ravensbergen |
| 2004/0263846 A1 * | 12/2004 | Kwan .......................... 356/399 |
| 2005/0018162 A1 | 1/2005 | Leenders et al. |
| 2005/0151951 A1 | 7/2005 | Hill |
| 2006/0256346 A1 | 11/2006 | Hill |
| 2008/0285051 A1 | 11/2008 | Hill |

FOREIGN PATENT DOCUMENTS

| | | |
|---|---|---|
| JP | 60-225005 | 11/1985 |
| JP | 64-18002 | 1/1989 |
| JP | 11-108614 | 4/1999 |
| JP | 11-230716 | 8/1999 |
| WO | WO 00/65302 | 11/2000 |

OTHER PUBLICATIONS

U.S. Appl. No. 60/869,483, filed Dec. 2006, Hill.
U.S. Appl. No. 60/869,482, filed Dec. 2006, Hill.
U.S. Appl. No. 10/218,968, filed Aug. 2002, Byoung-Sun Na.
Lis, Steven A.,"An Air Turbulence Compensated Interferometer for IC Manufacturing," SPIE 2440, [p. 467 (1995).
Arfken, G. "Gibbs Phenomenon", Mathematical Methods for Physicists, Academic Press (1966).
Bobroff, N., "Residual Errors in Laser Interferometry From Air Turbulence and Nonlinearity", Appl. Opt 26(13), pp. 907-926 (1987).
Bobroff, N., "Recent Advances in Displacement Measuring Interferometry," Measurement Science & Tech. 4(9), pp. 907-926 (1993).
Estler, W.T. "High-Accuracy Displacement Interferometry in Air," Appl. Opt. 24(6), pp. 808-815 (1985).
Jones, F.E., "The Refractivity of Air", J. Res. NBS 86(1), pp. 27-32 (1981).
Ishida, Akira, "Two Wavelength Displacement-Measuring Interferometer Using Second-Harmonic Light to Eliminate Air-Turbulence-Induced Errors," Jpn. J. Appl. Phys. 28(3), L473-475 (1989).
Zanoni, C., "Differential Interferometer arrangements for distance and angle measurements: Principles, advantages and applications", VDI Berichte Nr. 749, pp. 93-106 (1989).
Zhu, Y. et al., "Long-Arm Two-Color Interferometer for Measuring the Change of Air Refractive Index," SPIE 1319, Optics in Complex Systems, pp. 538-539 (1990).
International Preliminary Report on Patentability, issued on Jun. 24, 2009, corresponding to Int'l. Appln. No. PCT/US2007/088708, filed Dec. 21, 2007.
International Search Report for Int'l. Appln. No. PCT/US07/84819 dated Apr. 28, 2008.
International Search Report and Written Opinion for Int'l. Appln. No. PCT/US2006/043494 dated Mar. 20, 2008.

* cited by examiner

DISTANCE MEASURING INTERFEROMETER AND ENCODER METROLOGY SYSTEMS FOR USE IN LITHOGRAPHY TOOLS

CROSS REFERENCE TO RELATED APPLICATIONS

This application claims benefit of Provisional Patent Application No. 60/859,348, entitled "Distance Measuring Interferometer And Encoder Metrology Systems For Use In Lithography Tools With Properties Of Encoder System Measured And Monitored In Situ," filed on Nov. 15, 2006. This application also claims benefit of Provisional Patent Application No. 60/859,693, entitled "Distance Measuring Interferometer And Encoder Metrology Systems For Use In Lithography Tools With Properties Of Encoder System Measured And Monitored In Situ," filed on Nov. 17, 2006. The entire contents of both of the above-mentioned provisional applications are hereby incorporated by reference.

BACKGROUND

This disclosure relates to lithography systems and to in situ monitoring of components in lithography systems using combinations of interferometer metrology systems and encoder metrology systems.

Lithography systems are commonly used in fabricating large-scale integrated circuits such as computer chips and the like. The function of a lithography system is to direct spatially patterned radiation onto a photoresist-coated wafer. The process involves determining which location of the wafer is to receive the radiation (alignment) and applying the radiation to the photoresist at that location (exposure).

In general, a lithography system, also referred to as a lithography tool, an exposure system or an exposure tool, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and wafer chuck and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

During exposure, the radiation source illuminates the patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry metrology systems herein after referred to simply as interferometer systems are typically important components of the positioning mechanisms that control the positions of the wafer and reticle and register the reticle image on the wafer. Interferometry systems can be used to precisely measure the positions of each of the wafer stage and mask stage relative to other components of the exposure system, such as the lens assembly, radiation source or support structure. In such cases, the interferometry system can be attached to a stationary structure and a measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

There are various reasons that favor the operation of a lithography tool with the cavity of the lithography tool filled with a gas instead of where the cavity is evacuated. However, the presence of a dispersive medium such as the gas in the measurement and reference paths of an interferometric system used to monitor the position of the stage or stages of the lithography tool introduces uncertainty in measurements made using the interferometric system due to the atmospheric effects.

A difficult measurement related to the refractive index of a gas is the compensation of refractive index fluctuations over a measurement path of unknown or variable length, with uncontrolled temperature and pressure. An example situation is high-precision distance measuring interferometry, such as is employed in micro-lithographic fabrication of integrated circuits. See for example an article entitled "Residual Errors In Laser Interferometry From Air Turbulence And Nonlinearity," by N. Bobroff, *Appl. Opt.* 26(13), pp 2676-2682 (1987), and an article entitled "Recent Advances In Displacement Measuring Interferometry," also by N. Bobroff, *Measurement Science & Tech.* 4(9), pp 907-926 (1993). As noted in the aforementioned cited references, interferometric displacement measurements in a gas are subject to environmental uncertainties, particularly to changes in air pressure and temperature; to uncertainties in air composition such as resulting from changes in humidity; and to the effects of turbulence in the gas. Such factors alter the wavelength of the light used to measure the displacement. Under normal conditions the refractive index of air for example is approximately 1.0003 with a variation of the order of $1 \times 10^{-5}$ to $1 \times 10^{-4}$. In many applications the refractive index of air should be known with a relative precision of less than 0.1 ppm (parts per million) to less than 0.001 ppm, these two relative precisions corresponding to a displacement measurement accuracy of 100 nm and less than 1 nm, respectively, for a one meter interferometric displacement measurement.

There are frequent references in the art to heterodyne methods of phase estimation, in which the phase varies with time in a controlled way. For example, in a known form of prior-art heterodyne distance-measuring interferometer, the source emits two orthogonally polarized beams having slightly different optical frequencies (e.g. 2 MHz). The interferometric receiver in this case is typically comprised of a linear polarizer and a photodetector to measure a time-varying interference signal. The signal oscillates at the beat frequency and the phase of the signal corresponds to the relative phase difference. A further representative example of the prior art in heterodyne distance-measuring interferometry is taught in commonly owned U.S. Pat. No. 4,688,940 issued to G. E. Sommargren and M. Schaham (1987). These known forms of interferometric metrology do not generally compensate for fluctuations in refractive index of a gas in a measurement path of an interferometer.

One way to detect refractive index fluctuations is to measure changes in pressure and temperature along a measurement path and calculate the effect on the optical path length of the measurement path. Mathematical equations for effecting this calculation are disclosed in an article entitled "The Refractivity Of Air," by F. E. Jones, *J. Res. NBS* 86(1), pp 27-32 (1981). An implementation of the technique is described in an article entitled "High-Accuracy Displacement Interferometry In Air," by W. T. Estler, *Appl. Opt.* 24(6), pp 808-815 (1985). This technique provides approximate values and corrects for slow, global fluctuations in air density.

Another way to detect the effects of a fluctuating refractive index over a measurement path is by multiple-wavelength distance measurement. The basic principle may be understood as follows. Interferometers and laser radar measure the optical path length between a reference and an object, most often in open air. The optical path length is the integrated product of the refractive index and the physical path traversed by a measurement beam. In that the refractive index varies with wavelength, but the physical path is independent of wavelength, it is generally possible to determine the physical path length from the optical path length, particularly the contributions of fluctuations in refractive index, provided that the instrument employs at least two wavelengths. The variation of refractive index with wavelength is known in the art as dispersion and this technique is often referred to as the dispersion technique.

An example of a two-wavelength distance measurement system is described in an article by Y. Zhu, H. Matsumoto, T. O'ishi, *SPIE* 1319, Optics in Complex Systems, pp 538-539 (1990), entitled "Long-Arm Two-Color Interferometer For Measuring The Change Of Air Refractive Index." The system of Zhu et al. employs a 1064 nm wavelength YAG laser and a 632 nm HeNe laser together with quadrature phase detection. Substantially the same instrument is described in Japanese in an earlier article by Zhu et al. entitled "Measurement Of Atmospheric Phase And Intensity Turbulence For Long-Path Distance Interferometer," Proc. 3rd Meeting On Lightwave Sensing Technology, *Appl. Phys. Soc. of Japan*, 39 (1989).

An example of a two wavelength high-precision interferometry system for microlithography is represented by U.S. Pat. No. 4,948,254 issued to A. Ishida (1990). A similar device is described by Ishida in an article entitled "Two Wavelength Displacement-Measuring Interferometer Using Second-Harmonic Light To Eliminate Air-Turbulence-Induced Errors," *Jpn. J. Appl. Phys.* 28(3), L473-475 (1989). In the article, a displacement-measuring interferometer is disclosed which eliminates errors caused by fluctuations in the refractive index by means of two-wavelength dispersion detection. An Ar+ laser source provides both wavelengths simultaneously by means of a frequency-doubling crystal known in the art as BBO. The use of a BBO doubling crystal results in two wavelengths that are fundamentally phase locked, thus greatly improving the stability and accuracy of the refractive index measurement.

In U.S. Pat. No. 5,404,222 entitled "Interferometric Measuring System With Air Turbulence Compensation," issued to S. A. Lis (1995), there is disclosed a two-wavelength interferometer employing the dispersion technique for detecting and compensating refractive index fluctuations. A similar device is described by Lis in an article entitled "An Air Turbulence Compensated Interferometer For IC Manufacturing," *SPIE* 2440 (1995). Improvement on U.S. Pat. No. 5,404,222 by S. A. Lis is disclosed in U.S. Pat. No. 5,537,209. This patent discloses the addition of a second BBO doubling crystal to improve the precision of the phase detection means. The additional BBO crystal makes it possible to optically interfere two beams having wavelengths that are exactly a factor of two different. The resultant interference has a phase that is directly dependent on the refractive index but is substantially independent of stage motion.

Two two-wavelength distance measuring systems based on superheterodyne techniques are described in commonly owned U.S. Pat. No. 5,764,362 entitled "SUPERHETERODYNE METHOD AND APPARATUS FOR MEASURING THE REFRACTIVE INDEX OF AIR USING MULTIPLE-PASS INTERFEROMETRY" by Henry A. Hill and P. de Groot and U.S. Pat. No. 5,838,485 entitled "SUPERHETERODYNE INTERFEROMETER AND METHODS FOR COMPENSATING THE REFRACTIVE INDEX OF AIR USING ELECTRONIC FREQUENCY MULTIPLICATION" by Peter de Groot and Henry A. Hill. The contents of both of the two cited patents are herein incorporated in their entirety by reference. In both of the two referenced patents, contributions to measured phases due to effects of a gas in a measurement path are directly dependent on the refractive index but the contributions due to stage motion are substantially reduced. The first of the two referenced patents is based on multiple pass interferometry and the second referenced patent is based on electronic frequency multiplication.

Other commonly owned U.S. Patents relating to dispersion interferometry are U.S. Pat. No. 6,330,065 B1, U.S. Pat. No. 6,327,039 B1, No. 6,407,866, No. 6,525,825, No. 6,525,826 B2, No. 6,529,279 and No. 6,219,144 B1. The contents of the other commonly owned cited patents are herein incorporated in their entirety by reference.

A commonly owned U.S. patent relating to the measurement of intrinsic properties of a gas such as the reciprocal dispersive power is U.S. Pat. No. 6,124,931 ($\Gamma$ monitor). The contents of the commonly owned cited patent are herein incorporated in their entirety by reference.

A non-dispersive apparatus and method for the compensation of turbulent effects of a gas is described in commonly owned U.S. patent application Ser. No. 10/350,522 entitled "METHOD AND APPARATUS FOR COMPENSATION OF TIME-VARYING OPTICAL PROPERTIES OF GAS IN INTERFEROMETRY" by Henry A. Hill. Patent application Ser. No. 10/350,522 discloses compensating for turbulent effects of the gas on the direction of propagation of a first beam by using measured effects of the gas turbulence on the directions of propagation of the first beam and a second beam. The first and second beams are spatially separated and the directions of propagation of the first and second beams are substantially parallel. Gas turbulence effects on the measurement path length of the first beam are compensated by using the measured turbulent effects of changes in the direction of propagation of the first beam over the measurement path length and a known relationship between the effects of gas turbulence on the direction of propagation of a beam and on the corresponding effects on the optical path length. The contents of cited patent application Ser. No. 10/350,522 are incorporated herein in their entirety by reference.

Another non-dispersive apparatus and method for the compensation of turbulent effects of a gas is described in commonly owned U.S. patent application Ser. No. 10/701,759 entitled "COMPENSATION OF REFRACTIVITY PERTURBATIONS IN A MEASUREMENT PATH OF AN INTERFEROMETER" by Henry A. Hill. Patent application Ser. No. 10/701,759 discloses compensating for turbulent effects of the gas on the optical path length of a beam or the average optical path length of two beams of an interferometer system by using measured differential effects of the gas turbulence at a single wavelength on the relative measurement path lengths of a first beam and a second beam wherein cells of the gas that pass through the measurement path of the first beam are subsequently transported through the measurement path of the second beam. The directions of propagation of the spatially separated first and second beams are substantially parallel. The contents of cited U.S. patent application Ser. No. 10/701,759 are incorporated herein in their entirety by reference.

Another non-dispersive apparatus and method for the compensation for turbulence effects of a gas is described in commonly owned U.S. Provisional Application No. 60/676,190 entitled "COMPENSATION OF TURBULENT EFFECTS OF GAS IN MEASUREMENT PATHS OF MULTI-AXIS INTERFEROMETERS," the corresponding utility application No. 11/413,917, and the CIP of U.S. patent application Ser. No. 11/413,917 also entitled "COMPENSATION OF TURBULENT EFFECTS OF GAS IN MEASUREMENT PATHS OF MULTI-AXIS INTERFEROMETERS." The provisional and the two utility applications are by Henry A. Hill and the contents of the cited provisional and the two utility applications are incorporated herein in their entirety by reference.

The effects of stationary changes in the optical path length of measurement paths at a single wavelength can be compensated by using a procedure such as described in commonly owned U.S. Pat. No. 7,075,619 B2 entitled "IN-PROCESS CORRECTION OF STAGE MIRROR DEFORMATIONS DURING A PHOTOLITHOGRAPHY EXPOSURE CYCLE" and U.S. Pat. No. 6,842,256 entitled "COMPENSATION FOR EFFECTS OF VARIATIONS IN GAS REFRACTIVITY IN INTERFEROMETERS." The two U.S. patents are by Henry A. Hill and the contents of both thereof are incorporated herein in their entirety by reference.

Planar encoders such as described in U.S. Pat. No. 6,765,195 B1 entitled "METHOD AND APPARATUS FOR TWO-DIMENSIONAL ABSOLUTE OPTICAL ENCODING" by D. B. Leviton and in U.S. Pat. No. 6,937,349 B2 entitled "SYSTEMS AND METHODS FOR ABSOLUTE POSITIONING USING REPEATED QUASI-RANDOM PATTERN" by B. K. Jones and M. Nahum can be used for the monitoring of the position of an object such as the stage of the lithography tool. Planar encoder metrology systems generally exhibit reduced errors due to effects of a gas compared to a displacement measuring interferometer in a lithography tool. However, planar encoders can also exhibit an array of other errors such as cyclic errors, non-linear non-cyclic errors, geometric errors, Abbé offset errors (e.g., linear displacement errors that are caused by an offset of a measurement axis from a rotation axis), and environmental effects of changes in temperature.

SUMMARY

Methods and systems for measuring and monitoring the scales of planar encoders in a lithography tool in situ are disclosed. The encoder scales can be measured as a function of time in order to compensate for effects of a variety of errors (e.g., those mentioned above) in inferred positions of a measurement object being monitored using the encoder. The methods and systems disclosed herein can be used for high precision measurements, e.g., sub-nanometer and nanometer over the dimensions of a wafer with planar encoder systems.

In certain embodiments, combinations of interferometer systems and encoder systems are used in a metrology system. The encoder system furnishes information about changes in the position of a measurement object with reduced sensitivity to effects of a gas in the measurement object's environment. An associated interferometer system furnishes information for reducing (e.g., compensating) for effects of cyclic errors, non-linear non-cyclic errors, geometric errors, Abbé offset errors, and/or effects of changes in temperature on the scales of the encoder system. The encoder system can include planar and/or linear encoders.

A planar or linear encoder may be configured such that the effects of gas in the encoder's measurement paths do not substantially affect the repeatability of position measurements of the encoder at the nanometer and sub-nanometer level. However, the encoder systems should be calibrated at the nanometer and sub-nanometer level over scales of a wafer for use in lithography tools. The interferometer system can facilitate such calibration.

In some embodiments, multi-dimensional encoders (e.g., two-dimensional, three-dimensional encoders) and multi-axis non-dispersion and/or dispersion interferometers for multi-axis metrology systems can be used. Multi-axis metrology systems can be used in single and/or multi (e.g., dual) stage lithography tools wherein the interferometer systems are used to calibrate the planar encoders in situ at the nanometer and sub-nanometer level over the scale of wafers.

In embodiments, the processing of information in a stage metrology system including an interferometer system and encoder system generates superheterodyne signal quadratures and respective superheterodyne phases where the superheterodyne phases include contributions from errors of the encoder system and a reduced sensitivity (e.g., no sensitivity) to changes in position of a measurement object. The classification of the reduced sensitivity of the superheterodyne phases is based on a comparison to the sensitivity of corresponding heterodyne or homodyne phases of the interferometer system.

In some embodiments, conjugated quadratures or heterodyne signal quadratures with phases of the conjugated quadratures or of the heterodyne signal quadratures are generated from the heterodyne phases of the interferometer system. The phases of the heterodyne signal quadratures include a harmonic or non-harmonic of the corresponding heterodyne phases of the interferometer system compensated for errors such as cyclic errors, non-cyclic non-linear errors, geometric errors, surface figure errors of stage mirrors used as measurement objects, and respective Abbé offset errors. The phases of heterodyne signal quadratures can further include the phase of a first reference signal wherein the frequency of the first reference signal is different, e.g., 10 kHz or 100 kHz, from the frequency of a difference in frequency of measurement and reference beam components of the input beam to the corresponding interferometer system. The harmonic or non-harmonic of the heterodyne phase is equal to the ratio of pitch of an encoder scale and the respective displacement sensitivity of the interferometer system, e.g., $\lambda/4$ for a plane mirror interferometer where $\lambda$ is the wavelength of the metrology beam of the interferometer system. The corresponding superheterodyne signal quadratures with corresponding phases of the superheterodyne signal quadratures can be generated using the heterodyne signal quadratures of the interferometer system and the conjugated signal quadratures of the encoder system.

The phases of the superheterodyne signal quadratures include primarily only low frequency components such as generated by atmospheric turbulence in measurement and reference paths of the interferometer system and errors of the encoder system such as cyclic errors, non-linear non-cyclic errors, geometric errors, Abbé offset errors, and environmental effects of changes in temperature of the encoder system. The phases of the superheterodyne signal quadratures can be subsequently processed to calibrate in situ the encoder system and to monitor changes in the calibration of the encoder system.

Abbé offset errors are an increasingly important source of errors in interferometer system and encoder system stage metrology systems. In certain embodiments, compensation for the Abbé offset errors of the encoder system uses information obtained using the interferometer system and one or more artifact wafers. Such compensation can be based on techniques such as described, for example, in U.S. Provisional Patent Application No. 60/616,575 entitled "WAFER, WAFER CHUCK, AND WAFER STAGE METROLOGY SYSTEM ALIGNMENT AND CALIBRATION IN SINGLE AND MULTIPLE STAGE LITHOGRAPHY TOOLS" and corresponding U.S. patent application Ser. No. 11/246,942. Both of the provisional and non-provisional patent applications are by Henry A. Hill and Jeffrey Johnston and the contents thereof are incorporated herein in their entirety by reference. The location of the alignment marks used in the location and registering of the relative position of a wafer stage can be performed using alignment scopes and the interferometer system of the interferometer/encoder stage metrology system.

Aspects of the invention are summarized as follows.

In general, in a first aspect, the invention features a system that includes a moveable stage, an interferometer configured to provide information about a first degree of freedom of the stage, an encoder configured to provide information about a second degree of freedom of the stage, and an electronic processor configured to monitor the position of the stage based on the information about the first and second degrees of freedom.

Embodiments of the system can include one or more of the following features and/or features of other aspects. For example, monitoring the position of the stage can include using the information about the first degree of freedom from the interferometer to reduce uncertainty in the information about the second degree of freedom from the encoder. The uncertainty in the information about the second degree of freedom can include contributions to the information from low frequency sources of uncertainty in measurements made using the encoder. The low frequency sources can include cyclic errors, non-linear non-cyclic errors, geometric errors, Abbé offset errors, or environmental effects of changes in temperature of the encoder system The information about the first degree of freedom of the stage can include an interferometric signal related to an optical path difference between a first beam path and a second beam path, where the first beam path contacts an object attached to the stage. Monitoring the position of the stage can include determining interferometer signal quadratures based on the interferometer signal.

The encoder can include a sensor and a scale, and the information about the second degree of freedom can include an encoder signal generated by the sensor in response to relative motion between the sensor and the scale. Monitoring the position of the stage can include determining encoder signal quadratures based on the encoder signal.

The electronic processor can be configured to calibrate the encoder based on the information about the first and second degrees of freedom. Calibrating the encoder can include determining interferometer signal quadratures from the information about the first degree of freedom, determining encoder signal quadratures based on the information about the second degree of freedom, and determining a superheterodyne phase based on the interferometer signal quadratures and the encoder signal quadratures. The superheterodyne phase can be substantially insensitive to variations in the position of the stage.

Monitoring the position of the stage can include determining a superheterodyne phase based on the information about the first degree of freedom, a factor relating the information about the first degree of freedom to the information about the second degree of freedom, and a reference frequency. The factor relating the information about the first degree of freedom to the information about the second degree of freedom can be a ratio of a scale pitch of the encoder and a sensitivity of the interferometer to the first degree of freedom of the stage. The interferometer can produce an interference signal comprising the information about the first degree of freedom of the stage, and the interference signal has a frequency different from the reference frequency.

The first degree of freedom can be a position of the stage along a first axis. The second degree of freedom can be a position of the stage along a second axis. The first and second axes can be parallel. The first axis can be the same as the second axis.

The system can include a measurement object attached to the stage and the interferometer is configured to direct a beam to reflect from the measurement object to provide the information about the first degree of freedom of the stage.

The moveable stage can be configured to support a wafer or a . component of a flat panel display.

The interferometer can be a double pass interferometer. The interferometer can be a high stability plane mirror interferometer. The interferometer can be a multi-axis interferometer.

The encoder can include an object having a scale and a sensor positioned relative to the object to detect the scale as the object moves relative to the sensor. The sensor detects the scale by detecting illumination reflected or transmitted by the scale while the object moves relative to the detector. The object can be attached to the moveable stage.

The encoder can be a linear encoder. The encoder can be an optical encoder. The encoder can be an absolute encoder or an incremental encoder.

In another aspect, the invention features a lithography system for use in fabricating integrated circuits on a wafer, the system including an illumination system for imaging spatially patterned radiation onto the wafer, the above-mentioned system for monitoring the position of the wafer relative to the imaged radiation, and a positioning system for adjusting the position of the stage relative to the imaged radiation, wherein the wafer is supported by the stage. The lithography system can be a dual stage lithography system.

In another aspect, the invention features a lithography system for use in fabricating integrated circuits on a wafer, the system including an illumination system including a radiation source, a mask, a positioning system, a lens assembly, and the above-mentioned system, wherein during operation the source directs radiation through the mask to produce spatially patterned radiation, the positioning system adjusts the position of the mask relative to the radiation from the source, the lens assembly images the spatially patterned radiation onto the wafer supported by the stage, and the system monitors the position of the mask relative to the radiation from the source. The lithography system can be a dual stage lithography system.

In another aspect, the invention features a beam writing system for use in fabricating a lithography mask, the system including a source providing a write beam to pattern a substrate, a beam directing assembly for delivering the write beam to the substrate, the above-mentioned system for monitoring the position of the stage relative to the beam directing assembly, and a positioning system for positioning the stage and beam directing assembly relative one another, wherein the substrate is supported by the stage.

In general, in a further aspect, the invention features a method that includes using an interferometer to provide information about a first degree of freedom of a moveable stage, using an encoder to provide information about a second degree of freedom of the stage, and monitoring the position of the stage based on the information about the first and second degrees of freedom.

Implementations of the method can include one or more of the features discussed above.

In another aspect, the invention features a lithography method for use in fabricating integrated circuits on a wafer, the method including using the above-mentioned method to monitor the position of the stage, wherein the wafer is supported on the stage, imaging spatially patterned radiation onto the wafer, and adjusting the position of the stage.

In another aspect, the invention features a lithography method for use in the fabrication of integrated circuits including directing input radiation through a mask to produce spatially patterned radiation, positioning the mask relative to the input radiation, monitoring the position of the mask relative to the input radiation using the above-mentioned method, and imaging the spatially patterned radiation onto a wafer.

In another aspect, the invention features a lithography method for fabricating integrated circuits on a wafer including positioning a first component of a lithography system relative to a second component of a lithography system to expose the wafer to spatially patterned radiation, and monitoring the position of the first component relative to the second component using the above-mentioned method of claim.

In another aspect, the invention features a method for fabricating integrated circuits, the method including any of the lithography methods discussed above.

In another aspect, the invention features a method for fabricating a lithography mask, the method including directing a write beam to a substrate to pattern the substrate, positioning the substrate relative to the write beam, and monitoring the position of the substrate relative to the write beam using the above-mentioned method.

In general, in a further aspect, the invention features an electronics module including an electronic processor configured to receive information about a position of an object from an interferometer and information about a position of the object from an encoder, wherein during operation the electronic processor determines interferometer signal quadratures and encoder signal quadratures based on the information from the encoder, determines a superheterodyne phase based on the interferometer signal quadratures and the encoder signal quadratures, and outputs information about the position of the object based on the superheterodyne phase. Embodiments of the module can include one or more of the features discussed above in relation to other aspects.

Embodiments disclosed herein can include one or more of the following advantages. For example, a metrology system including an interferometer system and a planar encoder system can reduce the requirements placed on the encoder system, e.g., the encoder system does not have to handle a set of redundancy problems or the spatial patterns on the encoder scales may be a simple two dimensional grating.

Another advantage is that a planar encoder system of a metrology system including an interferometer system and an encoder system does not have to include absolute planar encoders.

Another advantage is that the turbulence effects of a gas in a lithography tool can be reduced (e.g., eliminated) down to the sub-nanometer level.

Another advantage is that the calibration of a planar encoder system of a metrology system including an interferometer system and an encoder system can be performed in situ.

Another advantage is that a metrology system including an interferometer system and an encoder system may be used on single and/or dual stage lithography tools.

Another advantage is that corrections for Abbé offset errors of an encoder system of a metrology system including an interferometer system and an encoder system can be performed based on information obtained by the interferometer system and one or more artifact wafers.

Other advantages will be apparent from the detail description, drawings, and claims.

BRIEF DESCRIPTION OF DRAWINGS

The structure and operation of embodiments disclosed herein may best be understood by reading the detailed description in conjunction with the drawings wherein disclosed embodiments' parts have assigned reference numerals that are used to identify them in all of the drawings in which they appear and wherein.

Like reference symbols in the various drawings indicate like elements.

DETAILED DESCRIPTION

Figure 1A:
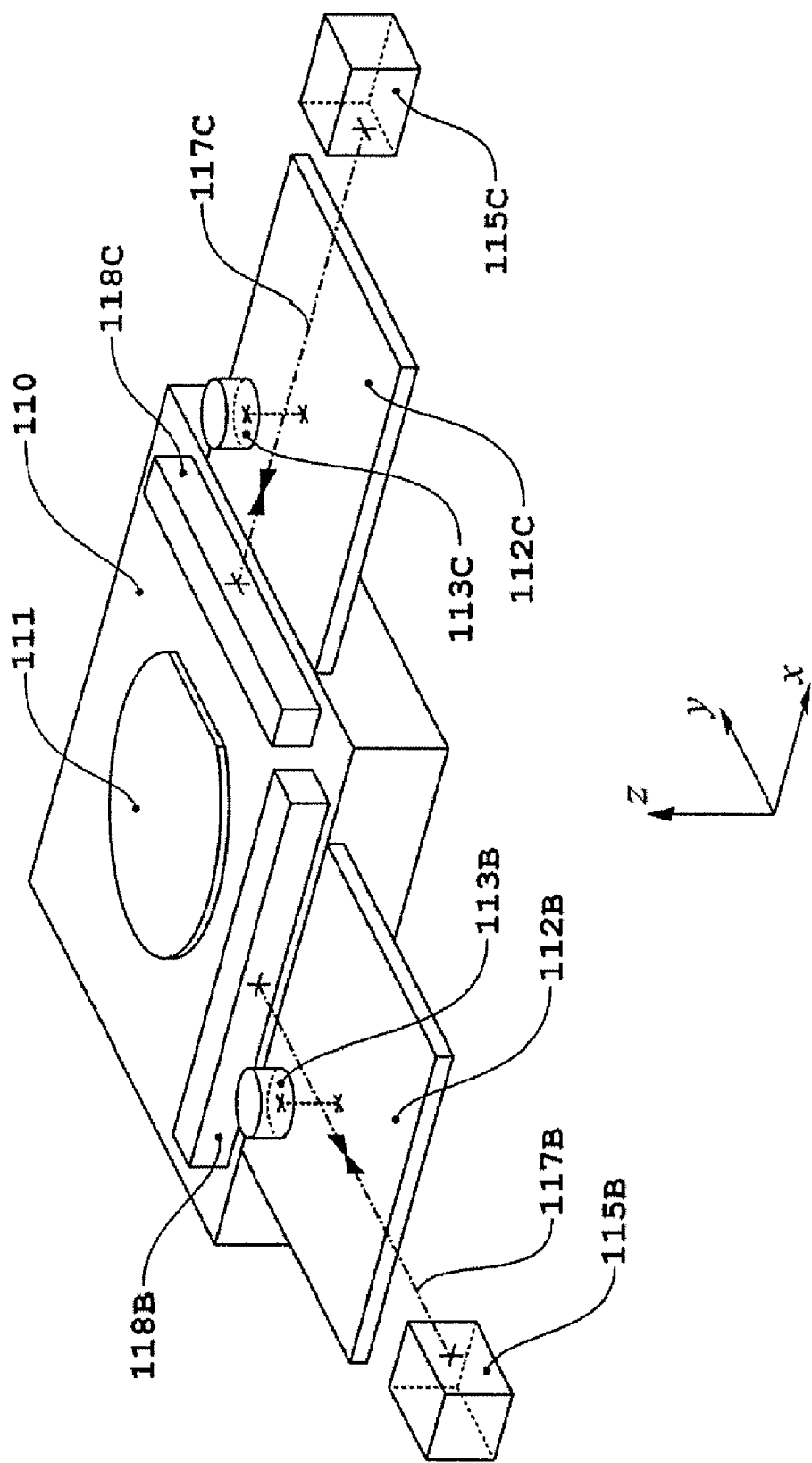
FIG. 1a is a perspective view of components in a single stage lithography tool with a stage metrology system including an interferometer system and encoder system.
Figure 1B:
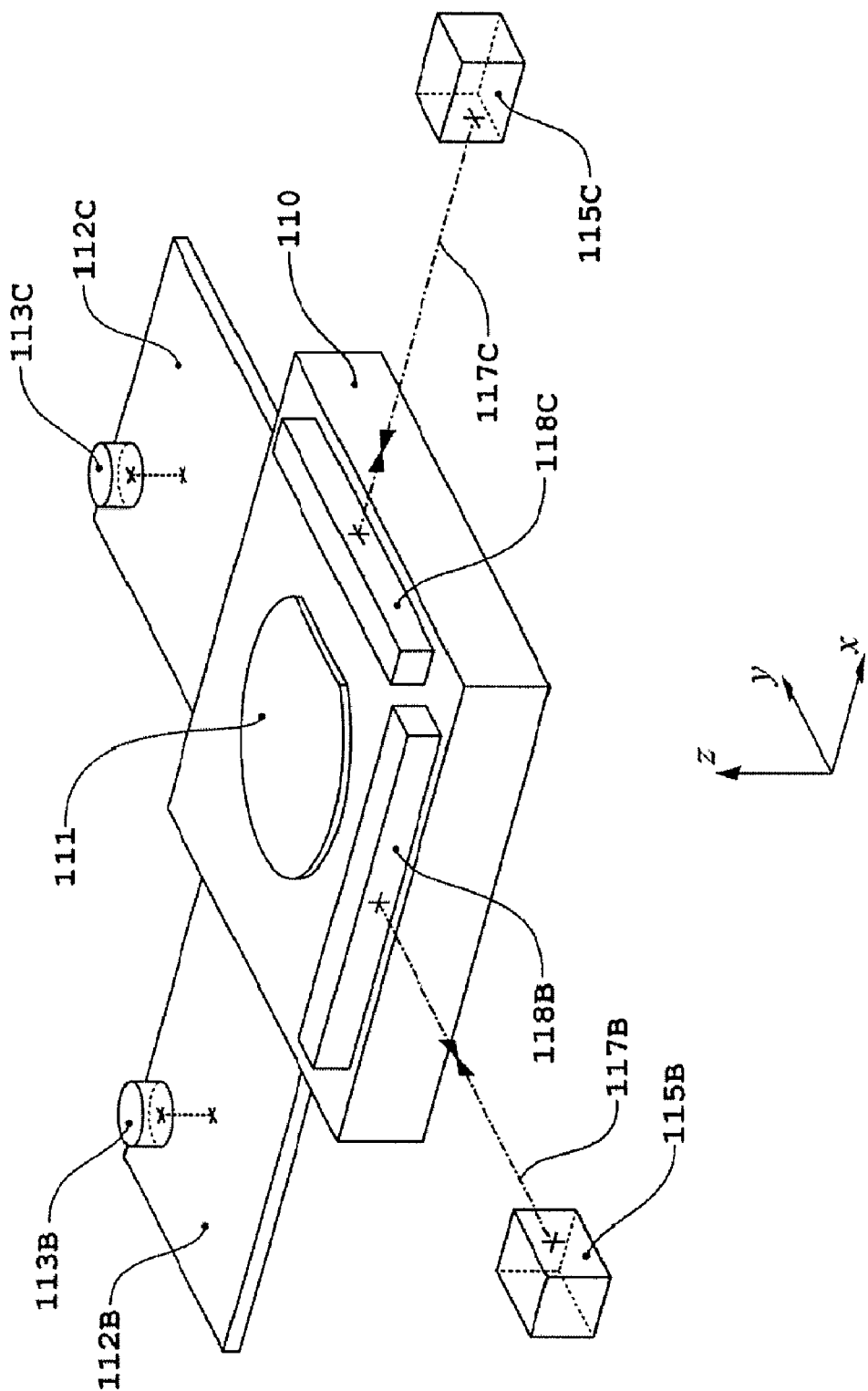
FIG. 1b is a perspective view of components in a single stage lithography tool with a stage metrology system including an interferometer system and encoder system.
Figure 1C:
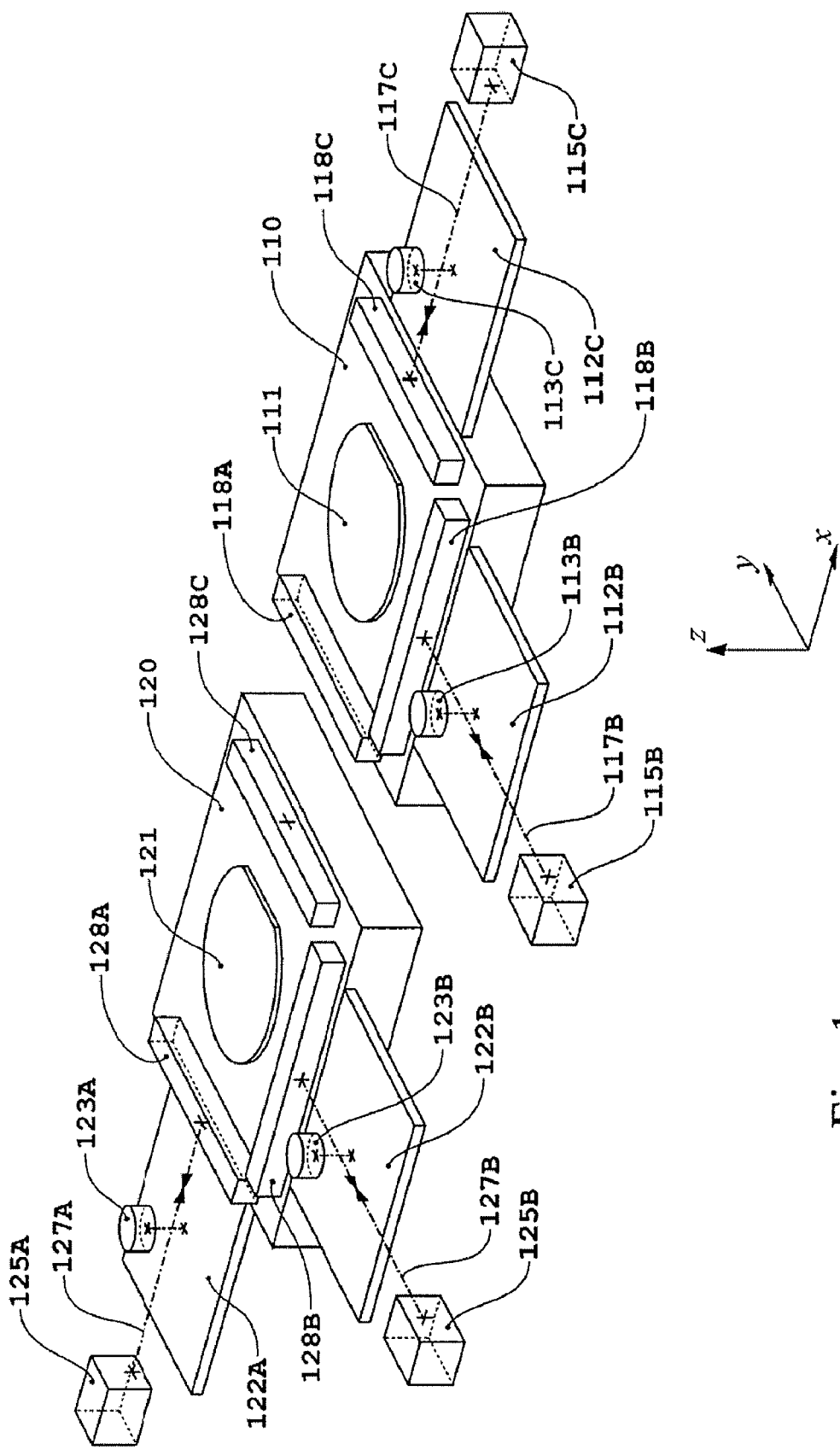
FIG. 1c is a perspective view of components in a dual stage lithography tool with a stage metrology system including an interferometer system and encoder system.
Figure 3:
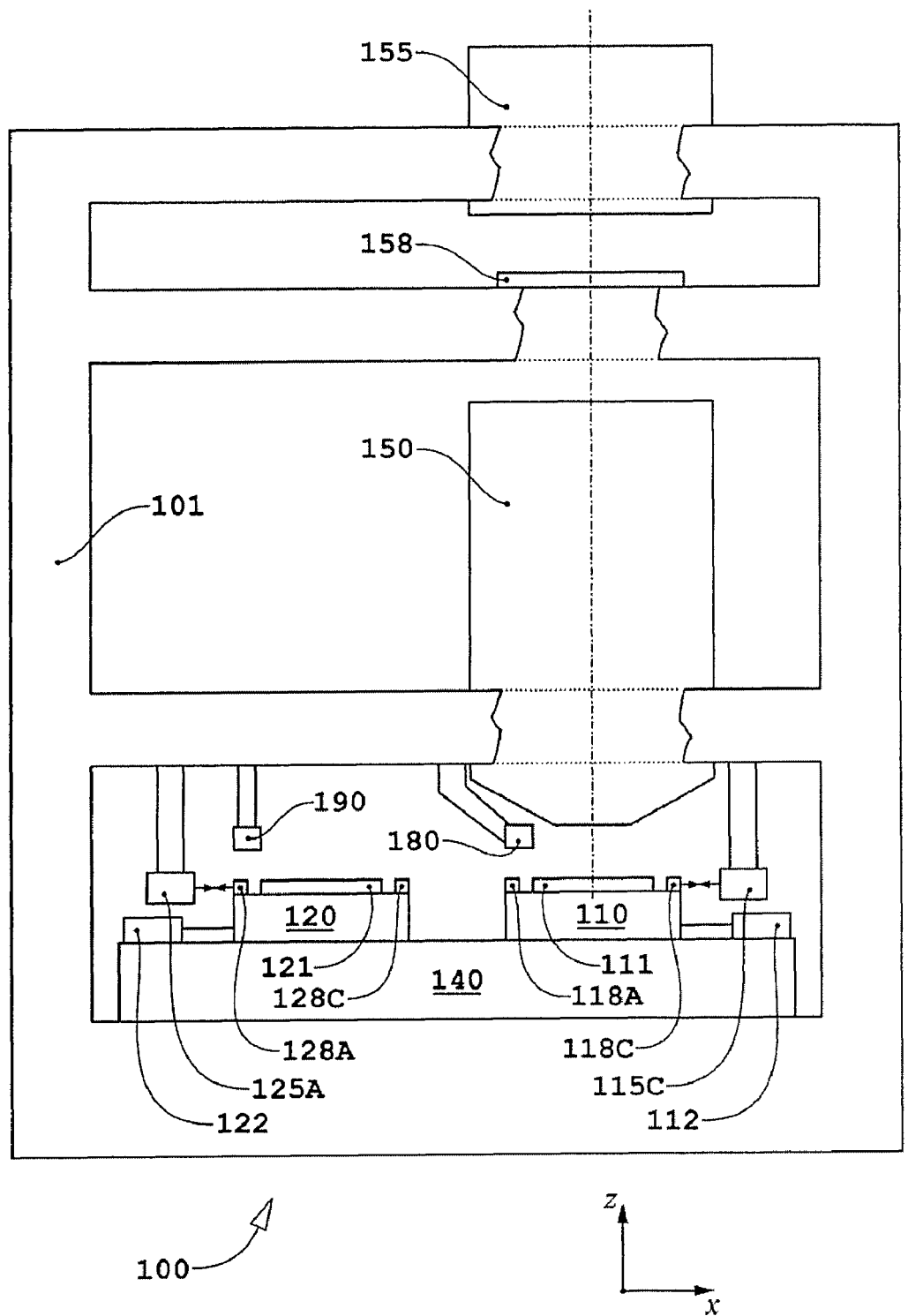
FIG. 3 is a schematic diagram of a dual stage lithography tool.

Referring to FIGS. 1c and 3, a dual stage lithography tool 100 includes two wafer stages, stage 110 and stage 120, located on a stage base 140 mounted on a frame 101. Stage 110 and stage 120 position and support wafer chucks 111 and 121, respectively. Stage 110 is located in an exposure position, relative to an alignment sensor 180 and an exposure lens system 150, which during operation directs radiation from a radiation source 155 to illuminate a wafer loaded in wafer chuck 111. During exposure of the wafer loaded in wafer chuck 111, a radiation beam from source 155 (e.g., an ultraviolet (UV) beam such as at 248 nm, 193 nm, 157 nm, or 13 nm) passes through beam shaping optics (e.g., transmissive and/or reflective optics) and travels downward toward stage 110 from radiation source 155. The radiation beam passes through a mask 158 carried by a mask stage. The mask is imaged onto the wafer on wafer stage 110 via exposure lens system 150.

Stage 120 is positioned in a load/unload position, relative to an alignment sensor 190. For lithography tools where loaded wafer chucks are exchanged between exposure and load/unload locations, the position of wafer chuck 121 is located on stage 120 by locating alignment features (also referred to as alignment marks or alignment artifacts) on wafer chuck 121 and the position of a newly loaded wafer relative to wafer chuck 121 is located by locating alignment marks on both wafer chuck 121 and wafer loaded in wafer chuck 121. For lithography tools where wafer stages are exchanged between exposure and load/unload locations, the position of a newly loaded wafer in wafer chuck 121 relative to wafer stage 120 is located by locating alignment marks on the newly loaded wafer in wafer chuck 121. In the load/unload position, a wafer exchanger (not shown) removes exposed wafers and replaces them with unexposed wafers and the location of the newly loaded wafer is determined while the tool exposes the wafer in wafer chuck 111.

For lithography tools where loaded wafer chucks are exchanged between exposure and load/unload locations, a chuck exchange system (not shown in figures) exchanges chucks 111 and 121 between the exposure position and the load/unload position. For lithography tools where wafer stages are exchanged between exposure and load/unload locations, a stage exchange system including a positioning system exchanges the stage 110 and 120 between the exposure position and the load/unload position. For both of the two different modes of operation, the positioning system for stages 110 and 120 includes stage actuators 112 and 122. Stage actuators 112 moves stage 110 while actuator 122 moves stage 120. The actuators translate the stages relative to either alignment sensor 190 or alignment sensor 180 when the stage is in the load/unload position or exposure position, respectively. Alignment sensors 180 and 190 can include interferometers (e.g., white light interferometers) that use alignment marks on wafer stages, wafer chucks, and/or artifact wafers that serve as both reference and measurement objects for the interferometers (see, e.g., U.S. PGPub. No. 2005-0151951 A1, the entire contents of which are incorporated herein by reference). With respect to the coordinate system shown in FIGS. 1c and 3, the actuators translate the stages in the x- and y-directions, and can pivot the stages about the x-, y-, and z-axes.

The stage exchange system may exchange the stages between the load/unload and exposure positions by rotating base 140 about an axis parallel to the z-axis. Alternatively, base 140 can include conveyors that translate the stages along paths in the x- and y-directions. In such embodiments, the positioning system can exchange the stages by first displacing one of the stages in the y-direction, and then moving both stages along parallel paths in opposite directions along the x-axis. Once their positions along the x-axis have been exchanged, the stage originally displaced along the y-axis is returned to its original y-coordinate, completing the exchange.

Base 140 and the various components supported by it can be isolated from environmental vibrations by a damping system, including, for example, air bearings.

A metrology system including an interferometry system and encoder system is used to monitor the position of stages 110 and 120 within tool 100. The interferometry system includes interferometers 115B and 115C, which monitor the position and orientation of stage 110 in the exposure position, and also includes interferometers 125A and 125B which monitor the position and orientation of stage 120 in the load/unload position. The encoder system includes encoder scales 122A, 122B, 112B, and 112C and encoder heads 123A, 123B, 113B, and 113C, respectively, that are associated with the interferometers 125A, 125B, 115B, and 115C, respectively. Interferometers 115B and 125B and corresponding encoders monitor stage displacements in the y-direction, while interferometers 115C and 125A and corresponding encoders monitor stage displacements in the x-direction. In the configuration shown in FIG. 1c, the interferometers and encoders monitor the stage positions/orientations by directing measurement beams to reflect from plane mirror measurement objects 118B, 118C, 128A and 128 B mounted on the stages and from the encoder scales 122A, 122B, 112B, and 112C, respectively.

In general, the encoder system features a sensor, transducer or readhead paired with a scale that encodes position. The sensor reads the scale and converts the encoded position into an analog or digital signal, which can then be decoded into position by, e.g., a digital readout. Motion can be determined by change in position over time. Encoder technologies include capacitive, inductive, eddy current, magnetic, and optical. Optical technologies include shadow, self imaging, and interferometric.

For lithography tools where loaded wafer chucks are exchanged between exposure and load/unload locations, two measurement objects are mounted on each stage: measurement objects 118B and 118C are mounted on stage 110; and measurement objects 128A and 128B are mounted on stage 120. For lithography tools where wafer stages are exchanged between exposure and load/unload locations, three measurement objects are mounted on each stage: measurement objects 118A, 118B, and 118C are mounted on stage 110; and measurement objects 128A, 128B, and 128C are mounted on stage 120. Measurement objects 118B and 118C reflect measurement beams 117B and 117C to interferometers 115B and 115C, respectively. Similarly, measurement objects 128A and 128B reflect measurement beams 127A and 127B to interferometers 125A and 125B, respectively Another positioning system positions mask 158 relative to radiation source 155 and exposure lens system 150. The positioning system can include, e.g., piezoelectric transducer elements and corresponding control electronics. Lithography tool 100 can also include an interferometry systems to monitor the position of the mask stage as well as other moveable elements whose position should be accurately monitored in processes for fabricating lithographic structures (see supra Sheats and Smith *Microlithography: Science and Technology*).

An electronic controller (e.g., a computer) is in communication with various components of tool 100 (e.g., with radiation source 155, lens system 150, alignment sensors 180 and 190, and interferometers 115B, 115C, 125A, and 125B and respective encoders) and co-ordinates the placement, exposure, and removal of wafers in the system. The electronic controller can include a user interface through which an operator can provide information and initiate various tool procedures.

In some embodiments of lithography tool 100, the interferometry system can be used to measure distance along multiple axes and angles associated for example with, but not limited to, the mask (or reticle) stages. Also, rather than a UV radiation, other radiation can be used to expose the wafer including, e.g., x-ray beams, electron beams, ion beams, and visible optical beams.

In some embodiments, the lithography tool can include what is known in the art as a column reference. In such embodiments, one or more of the interferometers direct a reference beam along an external reference path that contacts a reference mirror mounted on some structure that directs the radiation beam, e.g., a lens system 150. The reference mirror reflects the reference beam back to the interferometer. The interference signal produce by the interferometer when combining the measurement beam reflected from the measurement object on stage 110 and the reference beam reflected from a reference mirror mounted on the lens housing indicates changes in the position of the stage relative to the radiation beam. Furthermore, in some embodiments, the interferometry system can be positioned to measure changes in the position of reticle (or mask) stage or other movable components of lithography tool 100. In general, lithography tool 100 can be a scanning tool or a stepper tool.

Examples of dual stage lithography systems are also described in commonly owned U.S. patent application Ser. No. 10/411,890 entitled "INTERFEROMETRY SYSTEM ERROR COMPENSATION IN DUAL STAGE LITHOGRAPHY TOOLS" to Henry A. Hill the contents of which are incorporated herein by reference.

Although FIG. 3 shows a dual stage lithography system, the metrology methods and systems described herein can also be used in single stage lithography systems. In general, the lithography tools can be dry or immersion lithography tools.

Figure 5:
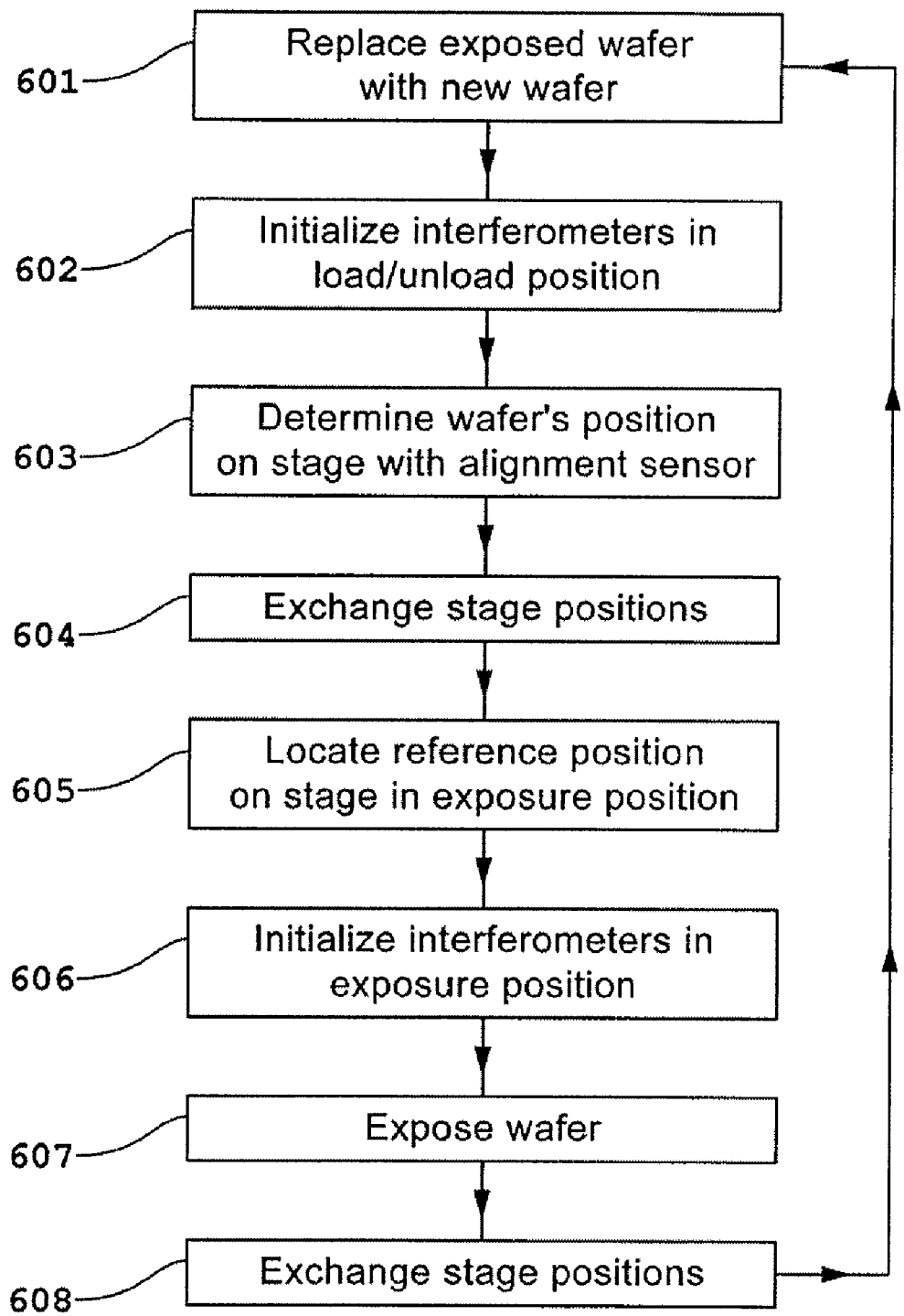
FIG. 5 is a schematic diagram of a high stability plane mirror interferometer (HSPMI).

Turning now to the operation of lithography tool 100, initially, operation is described briefly for a single wafer, followed by a more detailed description of various process steps. Lithography tool operation is summarized in a flow chart 600, shown in FIG. 5.

First, an exposed wafer is removed from stage 120 in the load/unload position, and a wafer exchanger places an unexposed wafer in its place (step 601). Tool 100 then initializes interferometers 125A and 125B and respective encoders (step 602), determines the location and orientation of the wafer on stage 120 using alignment sensor 180 and interferometers 125A and 125B and associated encoders (step 603). Tool 100 then exchanges the positions of stage 110 and stage 120, so that stage 120 is in the exposure position and stage 110 is in the load/unload position (step 604). Once stage 120 is in the exposure position, the tool locates a reference positions (e.g., corresponding to alignment marks) on the stage (step 605) and initializes interferometers 115B and 115C and respective encoders (step 606), and then positions the wafer relative to exposure apparatus 150. Tool 100 then proceeds to expose the wafer (step 607). Once the exposure is complete, tool 100 again exchanges the stages, moving stage 120 back to the load/unload position and stage 110 to the exposure position (step 608), and the procedure repeats.

Returning to the first step, step 601, when placed on stage 120, the location and orientation of the wafer on the stage is not always known to sufficient accuracy for the purposes of exposure. Although the wafer can be aligned when in the exposure position, the time taken aligning the wafer in the exposure position can slow down the exposure cycle and reduce wafer throughput. Thus, an alignment step is performed while the wafer is in the load/unload position and the information determined during this alignment is used to reduce alignment time in the exposure position.

The purpose of the alignment step is to determine the position and orientation of the wafer with respect to the stage. During alignment, tool 100 initializes interferometers 125A and 125B if stages are exchanged in order to register the stage to a reference frame shared by the interferometers. Subsequent movement of the stage within the reference frame is monitored to interferometric accuracy by the interferometers.

Initialization involves moving the stage to a known reference position in the load/unload position. The point at which the stage reaches the reference position is determined by locating the alignment marks on the stage. The reference position can correspond to a stage location in which a distance between interferometer 125A and measurement object 128A, and a distance between interferometer 125B and measurement object 128B are relatively small compared to the range of motion of the stage in the load/unload position. For example, in the reference position, these measurement objects can be less than about five centimeters from their respective interferometers.

Once the stage is in the reference position, an electronic controller initializes the system by noting a heterodyne interference phase of each signal received from interferometers 125A and 125B. Subsequent changes in these phases are used by the controller to track the location of the measurement objects, and correspondingly, the location of the stage and wafer with respect to the reference position.

After initialization, the location of the stage with respect to a reference frame is known, however, the location of the wafer on the stage is not. To determine the location of the wafer on the stage, the stage actuators scan the stage position until the wafer is located by alignment sensor 190. The location of alignment sensor 190 with respect to the reference frame is known from the system design and calibration. During this scanning, interferometers 125A and 125B monitor the location of the stage. The interferometer measurements can be compensated for systematic errors using data acquired for the system in the current configuration, improving the accuracy of the interferometer measurements. The stage scans the wafer's position until a sufficient number of alignment marks are identified to unequivocally determine the wafer's location and orientation on the stage. Electronic controller retains this information for use in aligning the wafer during exposure.

Once tool 100 has determined the wafer's location, and once the exposure cycle for the wafer on stage 110 is complete, tool 100 exchanges the stage positions, moving stage 120 and respective wafer to the exposure position. At this stage, although the location and orientation of the wafer on stage 120 are known, the location of the stage relative to lens system 150 is not known when stages are exchanged or the location of a wafer chuck relative to a wafer stage is not known when loaded wafer chucks are exchanged.

The position of stage 120 with respect to lens system 150 can be determined by moving the stage to a reference position. The reference position is identified by locating, for example, three or more alignment marks in the stage or the wafer chuck as appropriate. Once the reference position has been identified, tool 100 initializes interferometers 115B and 115C and respective encoders so that the tool can precisely position the wafer with respect to lens system 150, and can monitor the wafer's position during the exposure scan. When the wafer stages are exchanged, interferometer measurements can be compensated for systematic errors using previously acquired data corresponding to stage 120 in the exposure position. Due to the accuracy improvement provided by error compensation, initial wafer alignment with respect to lens system 150 can be performed to sufficient accuracy by locating fewer alignment marks than may be necessary in comparable systems that do not employ the error compensation.

The exposure proceeds by exposing the wafer to the exposure radiation while scanning (or stepping, where the lithography tool is a stepper) the wafer's position so that different portions of the wafer, e.g., corresponding to individual microchips or portions of individual microchips, are exposed. During the scanning, the tool monitors the wafers location using interferometers 115B and 115C and respective encoders, again compensating the interferometer and encoder measurements for systematic errors. Once the exposure is complete, stage 120 is returned to the load/unload position and the exposed respective wafer is replaced with a new wafer.

Location of Encoder Systems Relative to Interferometer Systems

Figure 1D:
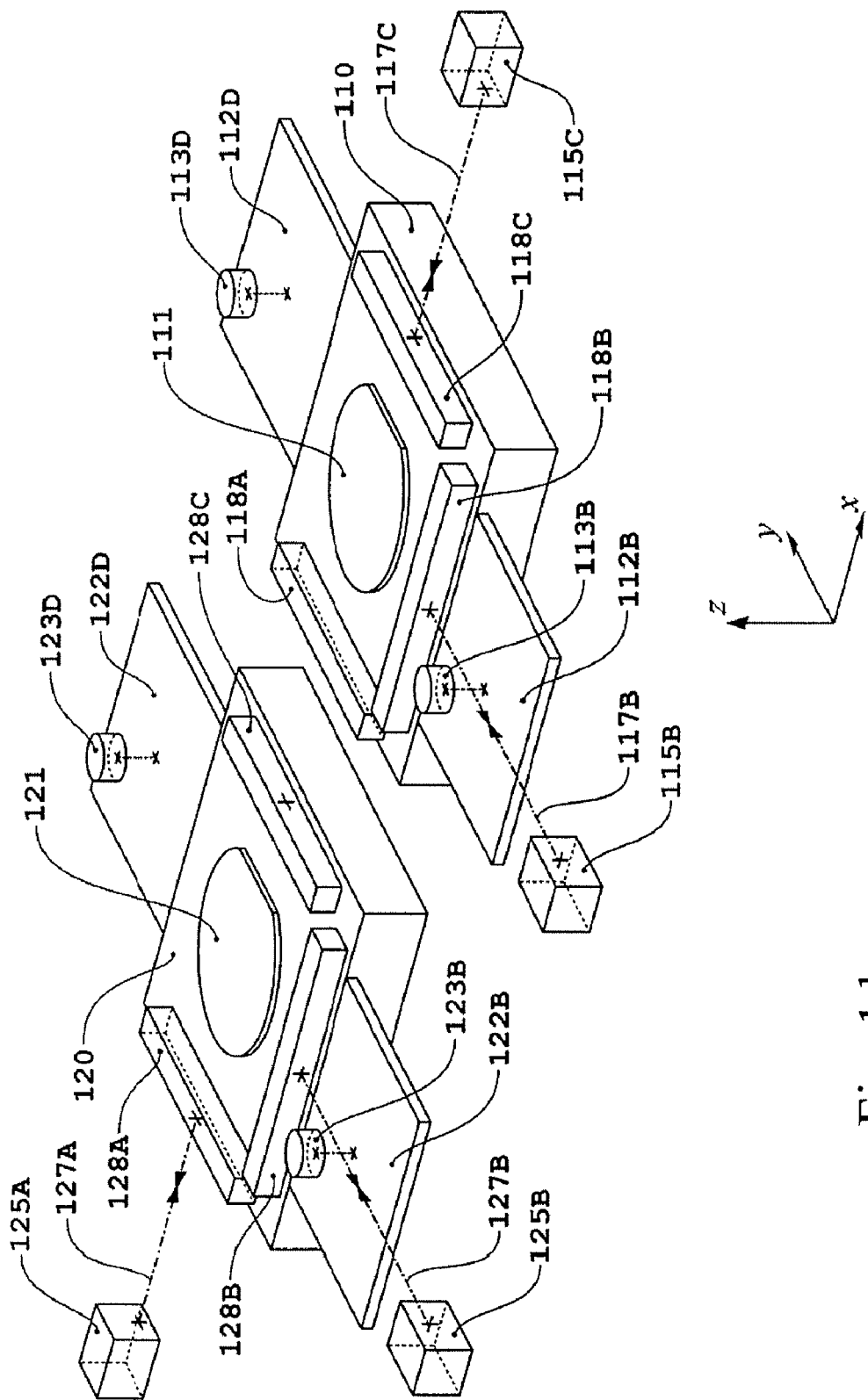
FIG. 1d is a perspective view of components in another dual stage lithography tool with a stage metrology system including an interferometer system and encoder system.

Encoder scales 122A, 122B, 112B, and 112C are located in FIG. 1c just under measurement beams 127A, 127B, 117B, and 117C. This location can reduce (e.g., minimize) the magnitude of Abbé offset errors associated with the respective encoders. Other positions of the encoder scales are also possible. For example, a perspective view of another interferometer system and encoder system is shown in FIG. 1d. The advantage of the another interferometer system and encoder system shown in FIG. 1d is that the magnitude of Abbé offset errors associated with encoders including encoder scales 122D and 112D can be reduced in relation to the corresponding Abbé offset errors for the interferometer system and encoder system is shown in FIG. 1c by placing the scale surfaces of the respective encoders closer to the plane of the wafer surface. Information about changes in pitch of stages 110 and 120 are obtained from interferometer 115B and 125B, respectively.

A perspective view of an interferometer system and encoder system for a single stage lithography tool is shown in FIG. 1a. The description of the interferometer system and encoder system for stage 110 shown in FIG. 1a is the same as the corresponding portion of the description given herein for the interferometer system and encoder system for stage 110 shown in FIG. 1c. A perspective view of another interferometer system and encoder system for a single stage lithography tool is shown in FIG. 1b.

The advantage of the another interferometer system and encoder system is shown in FIG. 1b is that the magnitude of Abbé offset errors associated with encoders including encoder scales 112B and 112C can be reduced in relation to the corresponding Abbé offset errors for the interferometer system and encoder system is shown in FIG. 1a by placing the scale surfaces of the respective encoders closer to the plane of the wafer surface of wafer 111.

Another advantage of the another interferometer system and encoder system shown in FIG. 1b is that encoder scales 112B and 112C do not significantly influence the gas flow pattern in the beam paths 117B and 117C.

Figure 2:
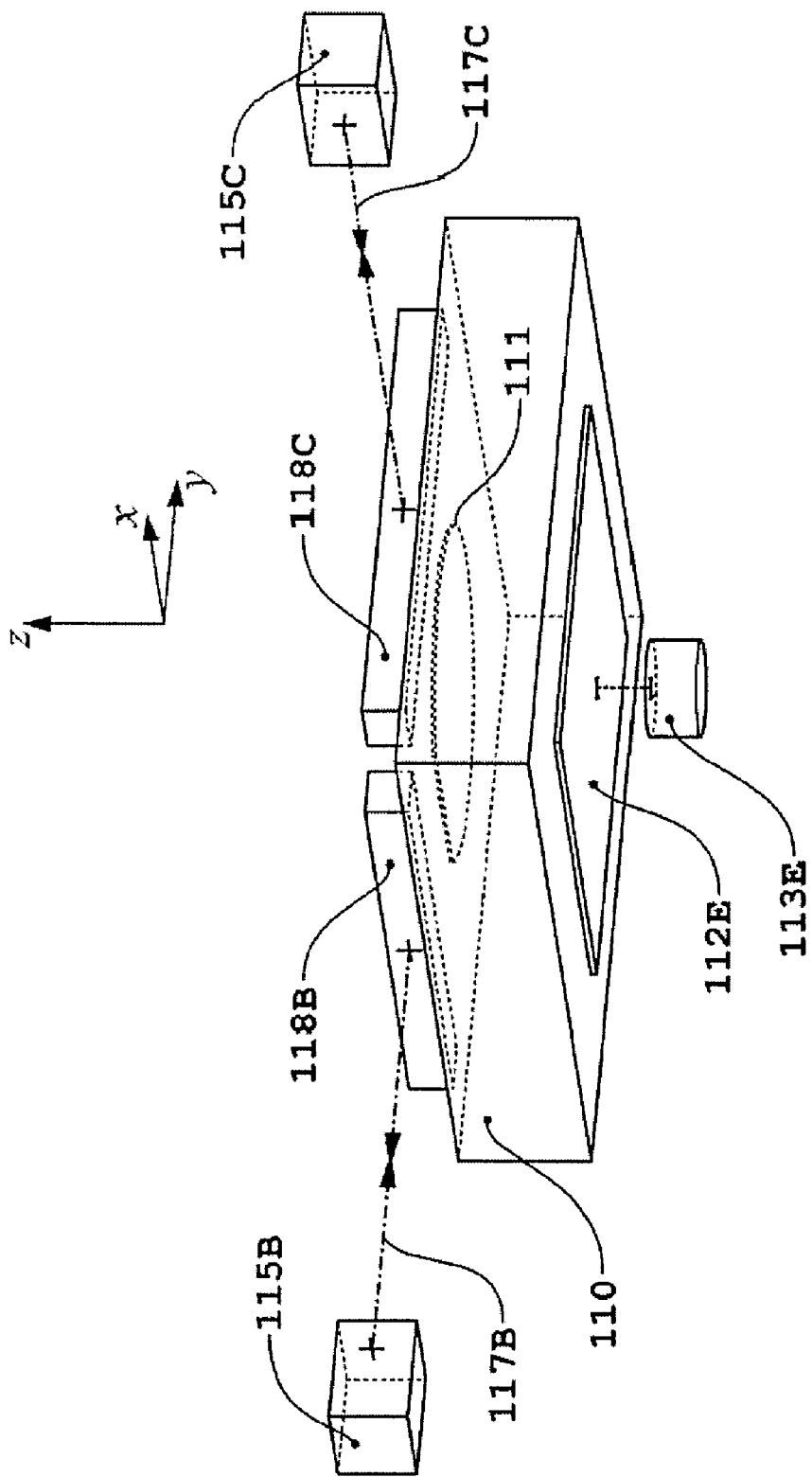
FIG. 2 is a perspective view of components in a single stage lithography tool with a stage metrology system including an interferometer system and encoder system.

A perspective view of an interferometer system and encoder system for a single stage lithography tool is shown in FIG. 2 wherein the encoder system includes a single encoder scale 112E and encoder head 113E located underneath stage 110. The axis of encoder detector 113E is aligned with the axis of the projection optic of a respective lithography tool. Information about changes in pitch and yaw of stage 110 are obtained from interferometer 115B and 115C. The interferometer system and encoder system shown in FIG. 2 has an increased magnitude of Abbé offset errors associated with encoder scale 113E but an advantage in a reduction of the number of encoder scales and encoder heads required. Another advantage of the interferometer system and encoder system shown in FIG. 2 is that encoder scale 112E does not significantly influence the gas flow pattern in the beam paths 117B and 117C.

In general, when a lithography tool aligns a wafer, it finds the user-definable locations where the alignment marks are located. In some embodiments, instead of a conventional wafer for processing, the alignment sensors can be used to locate alignment marks on a calibration wafer. A calibration wafer has a number of alignment marks positioned known displacements from each other. Calibration wafers can be used to recalibrate the stage metrology system by monitoring changes between the displacements measured with the metrology system between marks on the calibration wafer over time. In certain embodiments, a calibration wafer includes six to eight alignment mark sites located at about 70% of the wafer radius from the center of the wafer in a circular fashion. The tool can rotate the stage until each of the alignment marks is located by alignment sensor 190. From this data set, a model (e.g., a linear model) can be determined specifying a wafer grid and/or shot terms. The model can quantify the scaling, rotation and orthogonality of the wafer grid and the exposure shot terms. These model calculations can also quantify the alignment corrections for scaling, rotation and orthogonality of the tool. The model can then be subtracted from the measured alignment data resulting in alignment residuals, or non-linear errors (NLEs). The NLE is used here as a metric of the quality of the level alignment.

A calibration wafer can be used as a standard in not only calibrating the stage metrology system of a lithography tool but also in calibrating one stage metrology system of one lithography tool with respect to a stage metrology system of a other lithography tools. Alternatively, or additionally, a calibration wafer can also be used as a ball plate for inspecting coordinate measuring machines by placing spheres in each of the pyramidal pits. The ability to convert back and fourth from an artifact plate to a ball plate can further provide a technique for comparing lithographic coordinate metrology systems with other coordinate measuring machines.

The operation of interferometers 115B, 115C, 125A, and 125B and respective encoders and sources of systematic errors arising from the interferometry system and encoder system are next described. These errors can be characterized prior to the tool's use, and/or at times when the tool is offline. Although the components of the interferometry system (e.g., the interferometers and the measurement objects) and encoder system can be characterized prior to their installation in the tool, it may be advantageous to characterize them once they are installed as sources of the systematic errors can develop during their installation or use. For example, stresses due to the fastening of a stage mirror measurement object to the stage can distort the mirror's surface, resulting in systematic errors. Moreover, due to the use of different measurement objects with each interferometer due to the exchange of changes, errors in the interferometry system should be characterized for each permutation of the interferometry system, and compensated accordingly. Additional sources of systematic errors and methods for their characterization are described below.

Displacement measuring interferometers, such as those used in tool 100, monitor changes in the position of a measurement object relative to a reference object based on an optical interference signal. The interferometer generates the optical interference signal by overlapping and interfering a measurement beam reflected from the measurement object with a reference beam reflected from the reference object.

Figure 4:
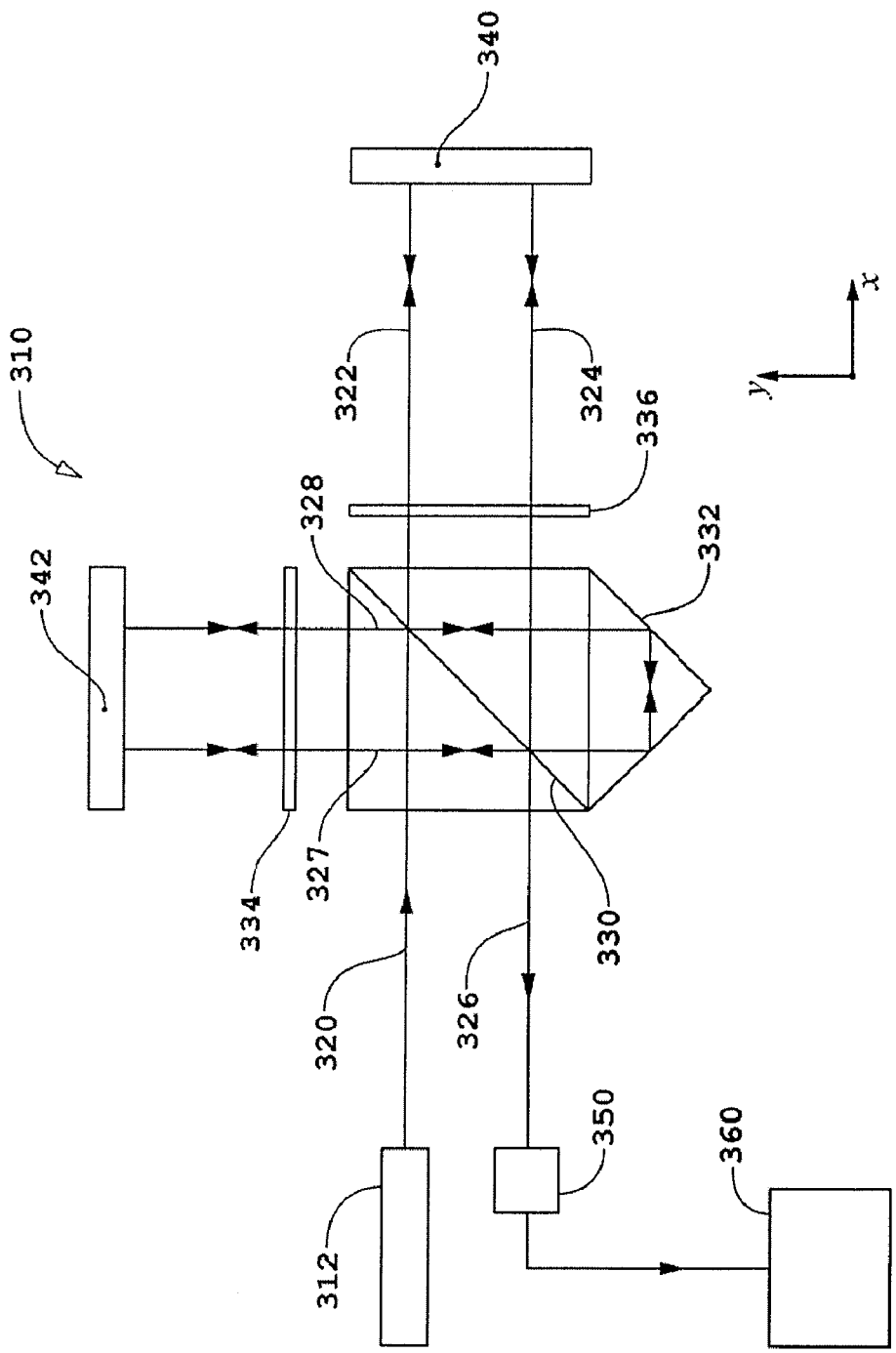
FIG. 4 is a flow chart showing the operation of the dual stage lithography tool.

Referring to FIG. 4, one example of a displacement measuring interferometer which is shown schematically is a high stability plane mirror interferometer (HSPMI) 310. In addition, interferometry 310 includes plane mirror measurement object 340, source 312, detector 350, and electronic processor and computer 360. HSMPI 310 includes polarization beam-splitter 330, retroreflector 332, quarter wave phase retardation plates 334 and 336, and plane mirror reference mirror 342. Source 312 directs an input beam 320 to HSPMI 310, which splits the input beam into two components. One component, shown as first and second pass measurement beams 322 and 324, reflects from measurement object 340 twice before exiting HSPMI 310. The other component, shown by first and second pass reference beams 328 and 327, reflect from a reference mirror 342 twice before exiting HSPMI 310. The exiting beam components overlap, and are shown as output beam 326.

In some embodiments, the measurement and reference beams have orthogonal polarizations and different frequencies (e.g., for heterodyne detection schemes). The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

Detector 350 includes a polarizer to mix the reference and measurement beam components of output beam 326 with respect to polarization. Detector 350 measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., due to translating the stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects, which in the case of HSPMI 310 is two. Changes in the phase of the measured interference signal correspond to changes in the relative position of the measurement object, e.g., a change in phase of $2\pi$ corresponds substantially to a distance change L of $\lambda/(2np)$. Distance 2L is a round-trip distance change or the change in distance to the measurement object from the interferometer. In other words, the phase $\Phi$, ideally, is directly proportional to L, and can be expressed as $$\Phi = 2pkL. \tag{1}$$

Unfortunately, the observable interference phase or heterodyne phase, $\tilde{\Phi}$, is not always identically equal to phase $\Phi$. Many interferometers include, for example, non-linearities such as those known as "cyclic errors." The cyclic errors can be expressed as contributions to the observable phase and/or the intensity of the measured interference signal and have a sinusoidal dependence on the change in for example optical path length 2pnL. In particular, a first order cyclic error in phase has for the example a sinusoidal dependence on $(4\pi pnL)/\lambda$ and a second order cyclic error in phase has for the example a sinusoidal dependence on $2(4\pi pnL)/\lambda$. Higher order cyclic errors can also be present as well as sub-harmonic cyclic errors and cyclic errors that have a sinusoidal dependence of other phase parameters of an interferometer system including detectors and signal processing electronics.

There are in addition to the cyclic errors, non-cyclic non-linearities, which are also termed "non-cyclic errors." One example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kurnit, A. Szöke, , F. Zernike, P. H. Lee, and A. Javan, "Accurate Laser Wavelength Measurement With A Precision Two-Beam Scanning Michelson Interferometer," *Applied Optics,* 20(5), 736-757, 1981.

A second source of non-cyclic errors is the effect of "beam shearing" of optical beams across interferometer elements and the lateral shearing of reference and measurement beams one with respect to the other. Beam shears can be caused for example by a change in direction of propagation of the input beam to an interferometer or a change in orientation of the object mirror in a double pass plane mirror interferometer such as the above-described HSPMI.

Accordingly, due to errors such as the aforementioned cyclic and non-cyclic errors, the observable interference phase typically includes contributions in addition to $\Phi$. Thus, the observable heterodyne phase is more accurately expressed as $$\tilde{\Phi} = \Phi + \psi + \zeta \tag{2}$$

where $\psi$ and $\zeta$ are the contributions due to the cyclic and non-cyclic errors, respectively. In displacement measuring applications, the observable phase is often assumed equal to 2pkL, which allows one to readily determine L from the measured phase. In many cases, this is a reasonable approximation, particularly where the contributions to due cyclic and/or non-cyclic errors are small, or the level of accuracy required by the application is relatively low. However, in applications demanding a high level of precision, cyclic and/or non-cyclic errors should be accounted for. For example, high precision displacement measurement requirements of integrated circuit micro-lithography fabrication have become very demanding, in part because of the small field limitations of imaging systems in steppers and scanners and in part because of the continuing reduction in the size of trace widths on wafers. The requirement of high precision displacement measurement with steppers and scanners is typically served with plane mirror interferometers with one of the external mirrors of the plane mirror interferometers attached to a stage mirror of the stepper or scanner.

Because the wafer is typically not perfectly flat, the orientation of the wafer stage should also be adjusted in one or more angular degrees of freedom to compensate for the non-flatness of the wafer at exposure sites on a wafer. The combination of the use of plane mirror interferometers and the change in one or more angular degrees of freedom is a source of lateral shear of optical beams across interferometer elements. Effects of beam shears of a reference beam and a measurement beam may be represented effectively as a common mode beam shear and a differential beam shear. The differential beam shear is the difference in lateral shear of reference and measurement and the common mode beam shear is the average lateral shear of the reference and measurement beams.

The aforementioned source of lateral beam shear presents a potentially serious problem in distance measuring interferometry. For example, for a measurement leg length of 1 meter, a typical value for a change in angular orientation of a stage mirror of 0.0005 radians, and a double-pass plane mirror interferometer, the relative lateral shear between the reference and the measurement components of the output beam of the interferometer is 2 millimeters. For a relative lateral shear of 2 millimeters, a beam diameter of, e.g., 6 millimeters, and wavefront errors in the output beam components of the order of $\lambda/20$, an error will be generated in the inferred distance measurement of $>$/$\sim$1 nanometer. This error is a non-cyclic error and can pose a serious limitation to micro-lithographic applications of steppers and scanners in integrated circuit fabrication.

In addition, wavefront errors are produced by imperfections in transmissive surfaces and imperfections in components such as retroreflectors, phase retardation plates, and/or coupling into multi-mode optical fibers that produce undesired deformations of wavefronts of beams.

Different techniques for quantifying cyclic errors are described in commonly owned U.S. Pat. Nos. 6,252,668, 6,246,481, 6,137,574, and 6,806,961 and U.S. patent application Ser. No. 11/060,173 entitled "ELECTRONIC CYCLIC ERROR CORRECTION" by Henry A. Hill. The entire contents each of which are incorporated herein by reference.

In order to compensate for these contributions, cyclic error compensating systems and methods can be used to determine a cyclic error function characterizing the cyclic error contribution to the observed phase. In some embodiments, in order to characterize cyclic errors, systems and methods are employed that analyze multiple measurements of an interference signal corresponding to different optical path length differences to quantify the nonlinearities. In particular embodiments, the time-varying interference signal or the phase extracted from the time-varying interference signal is Fourier transformed and at least some of the nonlinearities are associated with peaks in the square modulus of the Fourier transformed signal (i.e., the power spectrum). The amplitude and phase of the Fourier transform at the frequency of each such peak are used to quantify the associated nonlinearity. The frequency of each peak and whether it can be resolved typically depends on the rate of change of the optical path length difference, i.e., on the Doppler shift. Thus, the systems and methods often analyze multiple time-varying interference signals for each of multiple Doppler shifts to thereby resolve nonlinearities that may otherwise remain hidden, and also, to interpolate the contributions of the nonlinearities to measurements at different Doppler shifts. For example, the contribution of the nonlinearities can be interpolated for measurements when the measurement object is stationary or changing direction, i.e., when the Doppler shift is zero or is passing through zero.

One way to reduce non-cyclic errors in an interferometer is to use extremely high quality optical components. Commercially, this solution is unattractive because of the accompanying increase in cost of the interferometer. Another way to reduce errors is to quantify the errors in the interferometer prior to deploying the interferometer, and then compensate measurements made with the interferometer in its end use application based on the precompiled data.

In some embodiments, quantifying non-cyclic errors associated with an interferometer involves monitoring an observable phase associated with the interferometer output beam while scanning a parameter on which the phase depends. The non-cyclic error contribution to the observable phase is determined from the variation of the observable phase from a reference value, assuming other sources of error are negligible or otherwise compensated. The reference value can be based on another interferometrically generated phase, or can be based on a phase value determined from a mathematical relationship between the observable phase and the parameter being scanned.

Where the reference value is based on another interferometer phase, the reference value can be a redundant phase monitored with a reference interferometer during the scanning. Where the interferometer under test and reference interferometer are configured to monitor the same degree of freedom of the measurement object, the observable phase and redundant phase should be proportional in the absence of non-cyclic errors and other errors. Accordingly, any variation of the observable phase from this relationship can be attributed to the test interferometer non-cyclic errors. Of course, this assumes that the reference interferometer non-cyclic error contribution to the redundant phase measurement is negligible. To ensure this, the reference interferometer can be made using high-quality components to reduce sources of non-cyclic errors in the interferometer. Alternatively, or additionally, the reference interferometer can be operated in a way that reduces non-cyclic errors, e.g., operated a short distance from the measurement object to reduce beam shear, which is a source of non-cyclic errors. Another way to minimize non-cyclic errors in the redundant phase measurement is to use a reference interferometer with known non-cyclic errors. The reference value can then be determined by correcting the observable phase from the reference interferometer with the predetermined non-cyclic error contribution.

Another way to determine a reference value is from a known relationship (e.g., a mathematical formula) relating the scanned parameter to the observable phase. For example, a contribution to the observable phase by the optical path length difference between a measurement beam and a reference beam in an interferometer can be determined from the geometry of the interferometer. This geometric contribution is typically a function of parameters such as the orientation and position of the measurement object with respect to the interferometer. Accordingly, one can monitor the observable phase while scanning one of these parameters, and determine the non-cyclic errors as the variation of the observable phase from the predicted functional dependence of the phase on the scanned parameter.

Non-cyclic error data may be determined for components of interferometers in addition to the whole interferometer assembly. For example, when using a fiber optic pickup (FOP) to transport the interferometer output beam to a remotely positioned detector, artifacts from the interferometer, such as beam shear, can result in additional non-cyclic errors due to coupling the output beam into the FOP. Although these additional non-cyclic errors can be determined for the combined interferometer/FOP assembly, they can also be determined for the FOP alone. The principle for determining the non-cyclic error function for a component is the same as for the interferometer: a system monitors the observable phase generated by an interferometer using the component while scanning a parameter on which the phase depends. The non-cyclic error contribution is determined as the variation of the observable phase from a reference value, assuming that other sources of error are negligible or compensated. In some embodiments, non-cyclic errors in a FOP are measured as functions of differential and common mode beam shear of a two component optical beam, e.g., an output beam of a heterodyne interferometer system.

Important information about the interferometer system in addition to the non-cyclic error function can also be generated in the process of measuring the non-cyclic error function. The additional information may include the measurement axis of the interferometer system as a function of one or more parameters, e.g. the physical length of a measurement path and the directions of propagation of an input beam to the interferometer. For an interferometer assembly including two or more plane mirror interferometers, the process for measuring the non-cyclic error function can also map out the measurement axes for each of the two or more interferometers and may furnish accurate measurement of the separation of the two or more measurement axes. This information may be used to determine changes in angular displacements of the plane mirror measurement object in one or more planes.

Examples of apparatus and details of methods that can be used to characterize non-cyclic errors in interferometers and interferometer components are described in U.S. patent application Ser. No. 10/366,587 entitled "CHARACTERIZATION AND COMPENSATION OF NON-CYCLIC ERRORS IN INTERFEROMETRY SYSTEMS," to Henry A. Hill. The entire contents of the cited patent application are incorporated herein by reference.

Other systematic errors related to the lithography tool interferometry system can also be characterized prior to use of the tool. For example, another potential source of systematic errors in the tool's interferometry system mentioned above are imperfections in the reflecting surface of the measurement objects, e.g., variations in the mirror's surface topography. A measure of a mirror's surface topography is the mirror's figure. The figure of each measurement object can be characterized, for example, using a Fizeau interferometer. The figure of the portions of the measurement objects may also be determined by techniques such as described in commonly owned U.S. patent applications Ser. No. 09/853,114 entitled "IN-SITU STAGE MIRROR CHARACTERIZATION," Ser. No. 10/217,531, also entitled "IN-SITU MIRROR CHARACTERIZATION," filed on Aug. 13, 2002, and U.S. Pat. No. 7,019,843 entitled "Method And Apparatus For Stage Mirror Mapping." These applications and patent name Henry A. Hill as inventor and the entire contents of each is hereby incorporated herein by reference.

In some embodiments, the measurement objects are characterized in-situ using the lithography tool interferometers. Each measurement object is characterized using the corresponding interferometer in the exposure position and in the load/unload position. In-situ characterization may be advantageous because what is often important in determining errors associated with a mirror is not necessarily the actual physical deformation of the mirror, but its "effective" optical deformation with respect to the interferometric measurement beam(s) during the lithography exposure cycle. The effective optical deformation includes not only physical deformations in the mirrors, but also optical gradients along the measurement beam path caused by environmental effects, such as heat and air turbulence, produced by the movement of the stage during the photolithography exposure cycle. Such optical gradients can modify the propagation properties of the interferometric measurement beams in the same way as physical deformations in the mirrors. Thus, in some embodiments, the lithography tool implements a mirror characterization procedure in-process to incorporate the environmental effects into the characterization. The characterization is then used to correct in-process interferometric measurements of the stage.

Accordingly, systematic and random errors associated with the measurement objects may be compensated. The corrections account for pre-installation imperfections in the mirrors, deformations in the mirror caused by their installation, and environmental effects during a photolithographic exposure cycle that affect how the mirror surface "appears" to the interferometer used to monitor the stage position. Moreover, the corrections compensate for any in-process degradation of the mirror surfaces due to, e.g., delamination or dirt. Furthermore, the corrections may be averaged and continually updated during multiple cycles of the photolithography exposure cycle to improve their statistically accuracy without compromising the throughput of the lithography tool.

Such mirror characterization techniques can be based on interferometrically measuring the stage position with respect to multiple metrology axes to provide redundant information about the stage position. For example, in-plane rotation of the wafer stage may be measured twice based on separate interferometric measurement beams that contact two different sides of the wafer stage. The two in-plane rotation measurements may then be repeated as the position of the stage is stepped or scanned along a first axis (e.g., the x-axis). Differences between the multiple redundant measures may then be attributed to the effective optical deformation of a first stage mirror oriented parallel to that first axis. The process may then be repeated for multiple translations of the stage along a second axis (e.g., the y-axis) orthogonal to the first axis to determine the effective optical deformation of a second stage mirror oriented parallel to the second axis.

Characterizing an interferometer's systematic errors in these ways can yield one or more phase terms that are a function of the scanned parameters. These phase terms may be stored as, for example, a look-up table, as a power series representation, or as a spectral representation such as in a Fourier series. The phase terms for each interferometer may be the same for the different stages' measurement objects, but are more likely different. Scanned parameters may include the measurement object's position and/or orientation with respect to the interferometer, the position of the interferometer axis with respect to the pivot axis of the measurement object, beam shear, and directions of propagation of measurement and/or reference beams.

The error data may be stored on some electronic data storage medium (e.g., a memory chip or a disk), which is provided to the interferometer's end user. A control algorithm that runs the interferometry system in the tool accesses the non-cyclic error function from the data storage medium, and compensates the observable phase prior to making downstream calculations based on the phase.

Although the foregoing description refers to specific components and configurations of lithography tool 100, the similar concepts can be used in other embodiments. For example, although the foregoing description is with reference to HSP-MIs, in general, other types of displacement measuring interferometers can be used. Different types of interferometers include both single and multiple pass interferometers (the HSPMI is a double pass interferometer), and include passive interferometers, dynamic interferometers, and dispersion interferometers. Alternatively, or additionally, lithography tool 100 can include interferometers that monitor more than one degree of freedom, interferometers that monitor variations in angular orientation of a measurement object, and angular displacement interferometers that measure beam propagation direction.

Examples of dynamic interferometers are described in commonly owned U.S. patent application Ser. No. 10/226,591 entitled "DYNAMIC INTERFEROMETER CONTROLLING DIRECTION OF INPUT BEAM" by Henry A. Hill. Examples of passive zero shear interferometers are described in commonly owned U.S. patent application Ser. No. 10/207,314 entitled "PASSIVE ZERO SHEAR INTERFEROMETERS" by Henry A. Hill. Examples of angular displacement interferometers are described in commonly owned U.S. patent application Ser. No. 10/226,591 and U.S. Provisional Application 60/314,345 entitled "PASSIVE ZERO SHEAR INTERFEROMETERS USING ANGLE SENSITIVE BEAM-SPLITTERS" with both by Henry A. Hill and U.S. Pat. No. 6,917,432 entitled "INTERFEROMETERS FOR MEASURING CHANGES IN OPTICAL BEAM DIRECTION" by Henry A. Hill and Justin Kreuzer. Alternatively, or additionally, interferometry systems may include one or more differential angular displacement interferometers, examples of which are also described in U.S. Pat. No. 6,917,432. Examples of interferometry systems for measuring more than one degree of freedom and for reducing beam shear are described in U.S. patent application Ser. No. 10/352,616 entitled "MULTIPLE-PASS INTERFEROMETRY" by Henry A. Hill. Other forms of multiple pass interferometers are described in an article entitled "Differential interferometer arrangements for distance and angle measurements: Principles, advantages and applications" by C. Zanoni, VDI Berichte Nr. 749, 93-106 (1989). Examples of two-wavelength dispersion interferometers are described in U.S. Patent No. 6,219,144 B1 entitled "APPARATUS AND METHOD FOR MEASURING THE REFRACTIVE INDEX AND OPTICAL PATH LENGTH EFFECTS OF AIR USING MULTIPLE-PASS INTERFEROMETRY" by Henry A. Hill, Peter de Groot, and Frank C. Demarest and U.S. Pat. No. 6,327,039 B1 by Peter de Groot, Henry A. Hill, and Frank C. Demarest.

Furthermore, while in tool 100 the measurement objects are mounted on the stages and the interferometers are mounted on the frame, other configurations may be employed. For example, the interferometers can be mounted on the stages and the measurement objects on the frame. In some embodiments, the detectors can be located at a location remote from the interferometer, and the output beam can be directed to the detector using a fiber optic pickup (FOP). Some embodiments may include a column reference, which is described above.

In some embodiments, where the mask is regularly changed, a second mask stage can be employed in a similar fashion to the twin wafer stages. Where interferometers are used to monitor the mask positions, similar concepts to those described above may be employed to increase system throughput and/or improve accuracy of mask positioning. More generally, the concepts disclosed herein may be applied to other systems that utilize interferometric monitoring of component positions, wherein the component being monitored changes at different stages during operation.

Figure 6:
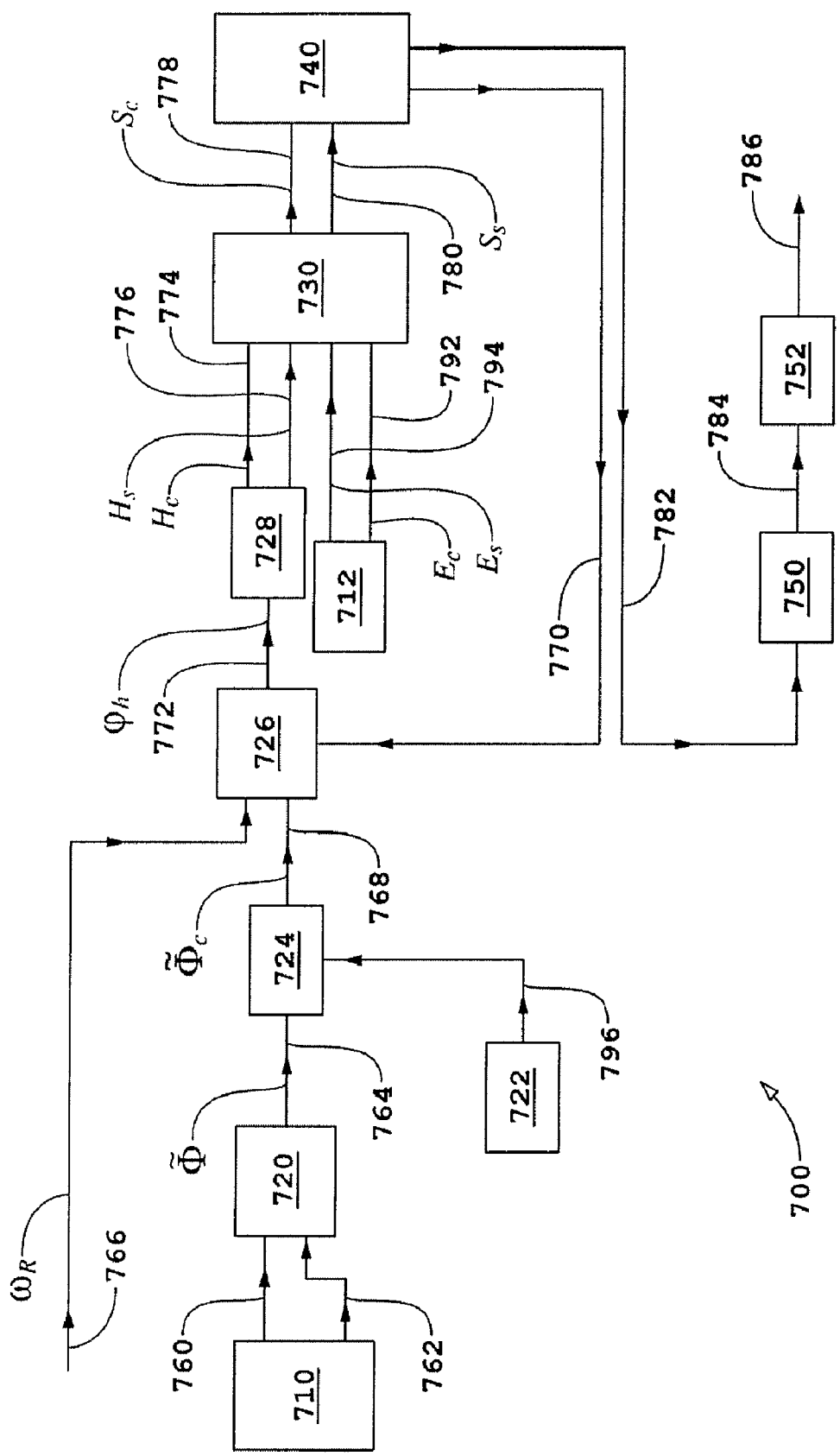
FIG. 6 is a representation of the signal processing for compensation of environmental and effects of other errors in a metrology system including an interferometer system and an encoder system.

Generation of Superheterodyne Signal Quadratures and Phases of Superheterodyne Signal Quadratures:

A representation of the processing of information in a stage metrology system 700 is shown in FIG. 6. Stage metrology system 700 includes an interferometer system 710 and encoder system 712 and generates a superheterodyne signal quadratures $S_c$ and $S_s$ which are shown in FIG. 6 as elements 778 and 780, respectively. From superheterodyne signal quadratures 778 and 780, a respective superheterodyne phase $\Theta$ shown as element 782 in FIG. 6 is generated for each of one or more degrees of freedom by phase meter 740. Phase 782 includes effects of errors of the encoder system 712 and a reduced sensitivity (e.g., no sensitivity) to changes in position of a measurement object. The classification of the reduced sensitivity of the phases of the superheterodyne signal quadratures is based on a comparison to the sensitivity of corresponding heterodyne or homodyne phases of the interferometer system.

Continuing with the description with reference to FIG. 6, interferometer system 710 sends heterodyne signal 760 and reference signal 762 to phase meter 720 wherein phase $\tilde{\Phi}$ of heterodyne signal 760 is determined. Phase $\tilde{\Phi}$ is shown as element 764. Phase 764 is transmitted to processor 724 where heterodyne phase $\tilde{\Phi}_c$ shown as element 768 is generated for the each of one or more degrees of freedom. Phase 768 is the observed value of phase 764 [see Eq. (2) and related discussion] compensated for interferometer system 710 errors such as cyclic errors, non-cyclic non-linear errors, geometric errors, surface figure errors of stage mirrors used as measurement objects, and respective Abbé offset errors. Information used in the compensation of $\tilde{\Phi}$ is obtained from system 722 as signal 796. System 722 may include, for example, wavelength monitors, dispersion interferometers, stage mirror mapping and monitoring apparatus, and monitors of the inverse dispersive power of a gas in the measurement paths of interferometer system 710.

Phase $\phi_h$ shown as element 772 is next generated by processor 726. Phase 772 includes the phase $\omega_R t$ of a reference signal quadratures (not to be confused with the reference signal 762) and a non-harmonic or harmonic of phase 768, i.e., $$\phi_h = \rho \tilde{\Phi}_c + \omega_R t, \quad (3)$$

where $\omega_R$ shown as element 766 is the frequency of the reference signal quadratures that is different, e.g., 10 kHz or 100 kHz, from the frequency $\omega$ of a difference in frequency of measurement and reference beam components of the input beam to interferometer system 710 and $\rho$ is the non-harmonic or harmonic scale factor shown as element 770 which is equal the ratio of pitch of an encoder scale of the encoder system 712 and the respective displacement sensitivity of interferometer system 710, e.g., $\lambda/4$ for a plane mirror interferometer where $\lambda$ is the wavelength of the metrology beam of interferometer system 710. A non-harmonic or harmonic of phase 768 may be a non-subharmonic or a subharmonic of phase 768.

A conjugated quadratures or heterodyne signal quadratures $H_c$ and $H_s$ shown as elements 774 and 776, respectively, are generated by processor 728 from heterodyne phase 772 for the each of one or more degrees of freedom. Heterodyne signal quadratures 774 and 776 may be written as $$H_c = A_H \cos \phi_h, \quad (4)$$

$$H_s = A_H \sin \phi_h, \quad (5)$$

where $A_H$ is the amplitude of the heterodyne signal quadratures. Encoder signal quadratures $E_c$ and $E_s$ shown as elements 792 and 794, respectively, from encoder system 712 may be written as $$E_c = A_E \cos \phi_E, \quad (6)$$

$$E_s = A_E \sin \phi_E \quad (7)$$

where $\phi_E$ and $A_E$ are the phase and amplitude, respectively, of the signal quadratures 792 and 794.

Superheterodyne signal quadratures 778 and 780 are generated from heterodyne signal quadratures 774 and 776 and encoder signal quadratures 794 and 792 according to the following formulae:

$$\begin{aligned} S_c &= H_c E_c + H_s E_s \quad (8) \\ &= A_H A_E \cos(\varphi_h - \varphi_E) \\ &= A_H A_E \cos\Theta, \end{aligned}$$

$$\begin{aligned} S_s &= H_s E_c - H_c E_s \quad (9) \\ &= A_H A_E \sin(\varphi_h - \varphi_E) \\ &= A_H A_E \sin\Theta. \end{aligned}$$

The phase $\Theta$ shown as element 782 of superheterodyne signal quadratures 778 and 780 includes primarily only low frequency components such as generated by atmospheric turbulence in measurement and reference paths of the interferometer system (note that other errors in the interferometer signals have already been compensated using other techniques) and errors of the encoder system such as cyclic errors, non-linear non-cyclic errors, geometric errors, Abbé offset errors, and environmental effects of changes in temperature of the encoder system. Phase 782 is subsequently processed by processor 750 to generate calibration signal 784 using, for example, Fourier series and transform analysis techniques, correlation techniques, and results obtained using artifact wafers to calibrate in situ the encoder system and to monitor changes in the calibration of the encoder system. Calibration signal 784 is processed by processor 752 to generate encoder system 712 signal 786 corrected for the errors in encoder signals 792 and 794. For example, variations in the superheterodyne phase can be attributed to low frequency sources of uncertainty in the encoder signal and can be used to correct measurements of the position of the stage made using the encoder to account for these errors.

Applications

As discussed, lithography tools are especially useful in lithography applications used in fabricating large scale integrated circuits such as computer chips and the like. Lithography tools are also used in fabricating flat panel display panels, such as liquid crystal display panels. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50-100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor. The methods and apparatus described above can improve overlay by reducing stage positioning errors associate with local refractivity variations in a lithography tool.

Figure 7A:
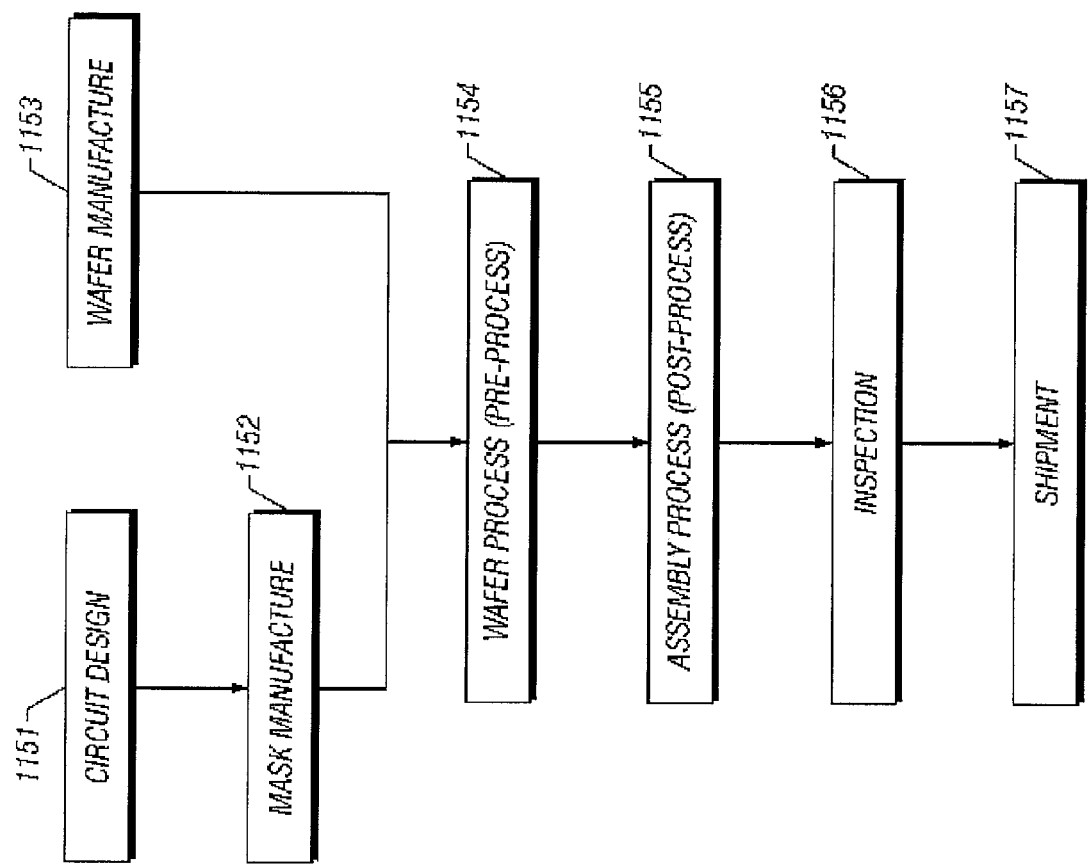
FIG. 7a and FIG. 7b are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 7a and 7b. FIG. 7a is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process. Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 7B:
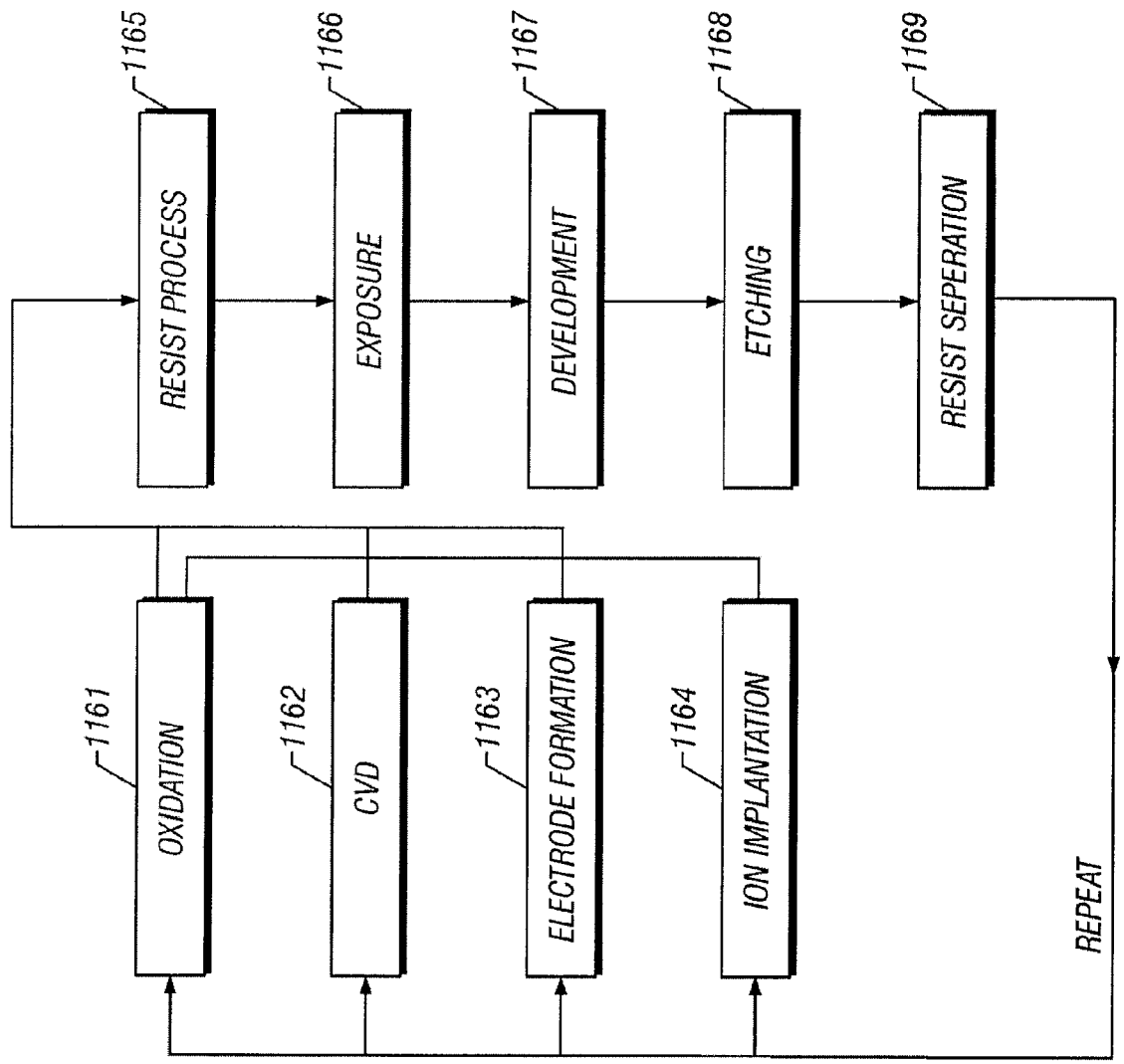

FIG. 7b is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 8:
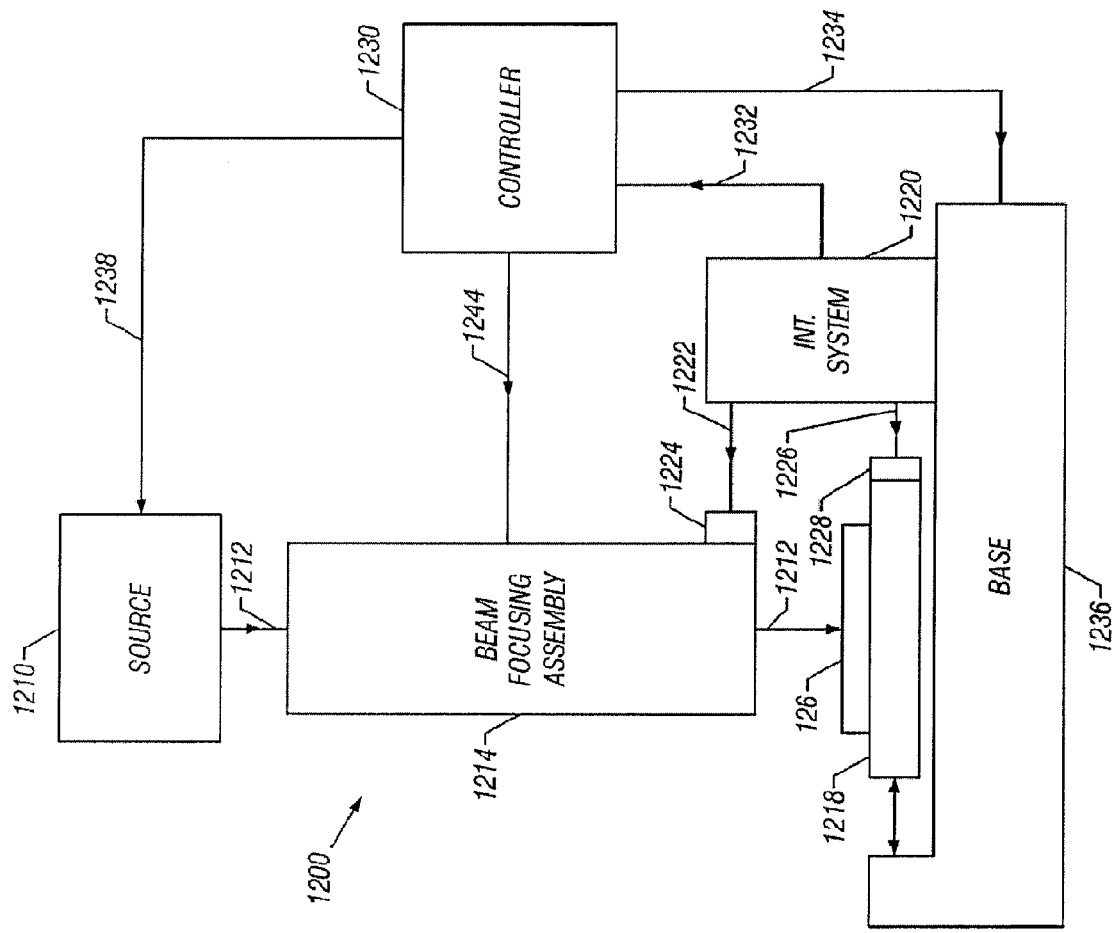
FIG. 8 is a schematic of a beam writing system that includes an interferometry system.

As an example, a schematic of a beam writing system 1200 is shown in FIG. 8. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

Other embodiments are in the following claims.

What is claimed is:

1. A system, comprising:
   a moveable stage;
   an interferometer configured to provide information about a first degree of freedom of the stage;
   an encoder configured to provide information about a second degree of freedom of the stage; and
   an electronic processor configured to monitor the position of the stage based on the information about the first and second degrees of freedom,
   wherein monitoring the position of the stage comprises determining a superheterodyne phase based on the information about the first degree of freedom, a factor relating the information about the first degree of freedom to the information about the second degree of freedom, and a reference frequency, where the factor relating the information about the first degree of freedom to the information about the second degree of freedom is a ratio of a scale pitch of the encoder and a sensitivity of the interferometer to the first degree of freedom of the stage.

2. The system of claim 1, wherein monitoring the position of the stage comprises using the information about the first degree of freedom from the interferometer to reduce uncertainty in the information about the second degree of freedom from the encoder.

3. The system of claim 2, wherein the uncertainty in the information about the second degree of freedom comprises contributions to the information from low frequency sources of uncertainty in measurements made using the encoder.

4. The system of claim 3, wherein the low frequency sources comprises cyclic errors, non-linear non-cyclic errors, geometric errors, Abbe offset errors, or environmental effects of changes in temperature of the encoder system.

5. The system of claim 1, wherein the information about the first degree of freedom of the stage comprises an interferometric signal related to an optical path difference between a first beam path and a second beam path, where the first beam path contacts an object attached to the stage.

6. The system of claim 5, wherein monitoring the position of the stage comprises determining interferometer signal quadratures based on the interferometer signal.

7. The system of claim 1, wherein the encoder comprises a sensor and a scale, and the information about the second degree of freedom comprises an encoder signal generated by the sensor in response to relative motion between the sensor and the scale.

8. The system of claim 7, wherein monitoring the position of the stage comprises determining encoder signal quadratures based on the encoder signal.

9. The system of claim 1, wherein the electronic processor is configured to calibrate the encoder based on the information about the first and second degrees of freedom.

10. The system of claim 9, wherein calibrating the encoder comprises determining interferometer signal quadratures from the information about the first degree of freedom, determining encoder signal quadratures based on the information about the second degree of freedom, and determining a superheterodyne phase based on the interferometer signal quadratures and the encoder signal quadratures.

11. The system of claim 10, wherein the superheterodyne phase is substantially insensitive to variations in the position of the stage.

12. The system of claim 1, wherein the interferometer produces an interference signal comprising the information about the first degree of freedom of the stage, and the interference signal has a frequency different from the reference frequency.

13. The system of claim 1, wherein the first degree of freedom is a position of the stage along a first axis.

14. The system of claim 13, wherein the second degree of freedom is a position of the stage along a second axis.

15. The system of claim 14, wherein the first and second axes are parallel.

16. The system of claim 14, wherein the first axis is the same as the second axis.

17. The system of claim 1, wherein the system comprises a measurement object attached to the stage and the interferometer is configured to direct a beam to reflect from the measurement object to provide the information about the first degree of freedom of the stage.

18. The system of claim 1, wherein the moveable stage is configured to support a wafer.

19. The system of claim 1, wherein the moveable stage is configured to support a component of a flat panel display.

20. The system of claim 1, wherein the interferometer is a double pass interferometer.

21. The system of claim 1, wherein the interferometer is a high stability plane mirror interferometer.

22. The system of claim 1, wherein the interferometer is a multi-axis interferometer.

23. The system of claim 1, wherein the encoder comprises an object having a scale and a sensor positioned relative to the object to detect the scale as the object moves relative to the sensor.

24. The system of claim 23, wherein the sensor detects the scale by detecting illumination reflected or transmitted by the scale while the object moves relative to the detector.

25. The system of claim 23, wherein the object is attached to the moveable stage.

26. The system of claim 1, wherein the encoder is a linear encoder.

27. The system of claim 1, wherein the encoder is an optical encoder.

28. The system of claim 1, wherein the encoder is an absolute encoder.

29. The system of claim 1, wherein the encoder is an incremental encoder.

30. A lithography system for use in fabricating integrated circuits on a wafer, the system comprising:
   an illumination system for imaging spatially patterned radiation onto the wafer;
   the system of claim 1 for monitoring the position of the wafer relative to the imaged radiation; and
   a positioning system for adjusting the position of the stage relative to the imaged radiation, wherein the wafer is supported by the stage.

31. The lithography system of claim 30, wherein the lithography system is a dual stage lithography system.

32. A lithography system for use in fabricating integrated circuits on a wafer, the system comprising:
   an illumination system including a radiation source, a mask, a positioning system, a lens assembly, and the system of claim 1,
   wherein during operation the source directs radiation through the mask to produce spatially patterned radiation, the positioning system adjusts the position of the mask relative to the radiation from the source, the lens assembly images the spatially patterned radiation onto the wafer supported by the stage, and the system monitors the position of the mask relative to the radiation from the source.

33. The lithography system of claim 32, wherein the lithography system is a dual stage lithography system.

34. A beam writing system for use in fabricating a lithography mask, the system comprising:
   a source providing a write beam to pattern a substrate;
   a beam directing assembly for delivering the write beam to the substrate;
   the system of claim 1 for monitoring the position of the stage relative to the beam directing assembly; and
   a positioning system for positioning the stage and beam directing assembly relative one another,
   wherein the substrate is supported by the stage.

* * * * *